(12) United States Patent
Shiu et al.

(10) Patent No.: US 12,087,644 B2
(45) Date of Patent: Sep. 10, 2024

(54) METHODS OF DETERMINING PROCESS RECIPES AND FORMING A SEMICONDUCTOR DEVICE

(71) Applicant: Taiwan Semiconductor Manufacturing Co., Ltd., Hsinchu (TW)

(72) Inventors: Jung-Hau Shiu, New Taipei (TW); Ching-Yu Chang, Taipei (TW); Jei Ming Chen, Tainan (TW); Jr-Yu Chen, Taipei (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 449 days.

(21) Appl. No.: 17/493,209

(22) Filed: Oct. 4, 2021

(65) Prior Publication Data
US 2022/0367293 A1    Nov. 17, 2022

Related U.S. Application Data

(60) Provisional application No. 63/188,598, filed on May 14, 2021.

(51) Int. Cl.
*H01L 21/02* (2006.01)
*H01L 21/66* (2006.01)

(52) U.S. Cl.
CPC ........ *H01L 22/12* (2013.01); *H01L 21/02186* (2013.01); *H01L 21/0228* (2013.01)

(58) Field of Classification Search
CPC .............. C23C 16/06; C23C 16/45527; C23C 16/455; C23C 16/52; H01L 22/12; H01L 22/14; H01L 22/30; H01L 22/26; H01L 22/20; H01L 21/66; H01L 21/02186; H01L 21/02; H01L 21/0228; H01L 21/02164; H01L 21/02211; H01L 21/02219; H01L 21/02274; H01L 21/0332; H01L 21/033; H01L 21/0337; H01L 21/311; H01L 21/67069; H01L 21/67; H01L 21/67103; H01L 21/67213
See application file for complete search history.

(56) References Cited

FOREIGN PATENT DOCUMENTS

| CN | 110396676 A | 11/2019 |
|---|---|---|
| CN | 107868944 B | 2/2020 |

*Primary Examiner* — Nikolay K Yushin
(74) *Attorney, Agent, or Firm* — Slater Matsil, LLP

(57) ABSTRACT

In an embodiment, a method includes performing a first atomic layer deposition (ALD) process to form a first material layer over a first blank wafer, the first ALD process comprising: performing a first precursor sub-cycle using a first precursor; performing a first purge sub-cycle using a inert gas; and performing a second precursor sub-cycle using a second precursor and the inert gas; and performing a second purge sub-cycle for a first duration over a second blank wafer different from the first blank wafer using the inert gas to deposit first defects onto the second blank wafer.

20 Claims, 20 Drawing Sheets

METHODS OF DETERMINING PROCESS RECIPES AND FORMING A SEMICONDUCTOR DEVICE

PRIORITY CLAIM AND CROSS-REFERENCE

This application claims the benefit of U.S. Provisional Application No. 63/188,598, filed on May 14, 2021, which application is hereby incorporated herein by reference.

BACKGROUND

Double patterning is a technology developed for lithography to enhance feature density in integrated circuits. Typically, the lithography technology is used for forming features of integrated circuits on wafers. The lithography technology involves applying a photo resist and defining patterns in the photo resist. The patterns in the photo resist are first defined in a lithography mask, and are implemented either by the transparent portions or by the opaque portions of the lithography mask. The patterns in the lithography mask are transferred to the photo resist through an exposure using the lithography mask, followed by the development of the photo resist. The patterns in the patterned photo resist are then transferred to the manufactured features, which are formed on a wafer.

Various techniques have been created to implement double or multiple patterning. One technique is a lithography-etch-lithograph-etch (LELE) technique. In a LELE technique, a pattern is generally divided into multiple parts to be implemented using multiple, respective lithography followed by etch steps. Another technique is a self-aligned technique. In a self-aligned technique, a pattern is generally formed by forming a mandrel and spacers on sidewalls of the mandrel, where the spacers are the pattern to be formed in the underlying substrate. In these techniques, the goal is to decrease a width between neighboring features, thereby increasing density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
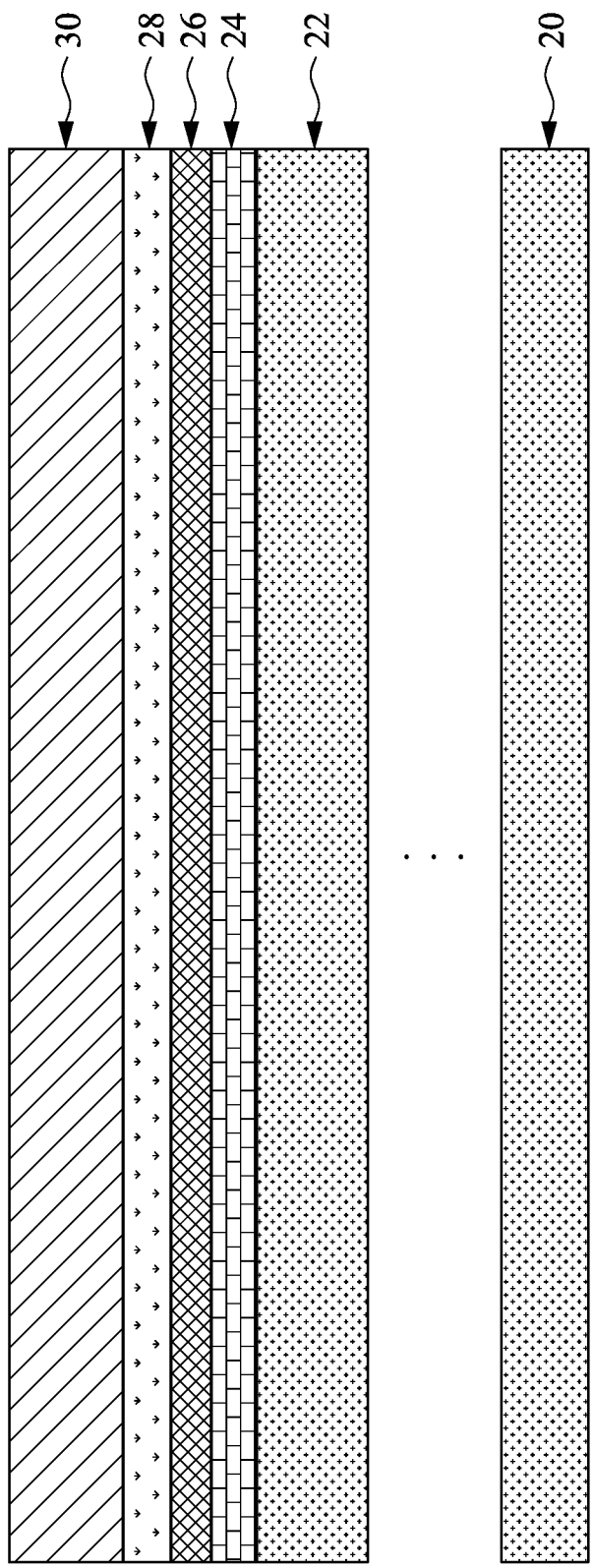
FIGS. 1 through 7 are cross-sectional views of intermediate structures during an example method for forming features of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to one or more methods for improving techniques and recipes for various semiconductor processing steps, such as etching structures during fabrication of a semiconductor device. In particular, certain processing steps may include an atomic layer deposition (ALD) process to form a material layer over an intermediate structure. In some cases, it may be necessary for the material layer to be formed to high critical dimensions and with minimal process variations from wafer to wafer. As discussed herein, some of these ALD processes may utilize a viscous precursor that is susceptible to remaining in gas lines and other regions of the deposition system after completion of the ALD process (including after a final purge processing sub-step). As such, subsequent ALD processes using the same deposition system may cause some of the remaining viscous precursor to deposit onto subsequent wafers as defects (e.g., reacting and/or adsorbing).

A pre-fabrication methodology may be performed for one of the ALD process described above prior to beginning the fabrication of a semiconductor device. In particular, the pre-fabrication methodology may be used to determine one or more parameters of the ALD process, such as a duration of time for a final purge sub-cycle after forming the material layer. For example, the pre-fabrication methodology may include performing the ALD process to deposit the material layer over a test wafer be followed by purges of the gas lines of the deposition system over a series of blank wafers for limited durations of time. As noted above, the purges deposit the defects (e.g., the remaining viscous precursor and reaction byproducts of the viscous precursor) onto the blank wafers. In addition, the pre-fabrication methodology includes performing the ALD process again to deposit the material layer over each of the blank wafers which include the defects (e.g., the viscous precursor reacting and/or being adsorbed on the wafer). The resulting material layers will have varying thicknesses due to the defects becoming part of those material layers. Analyses of the quantities of the defects as well as of the thicknesses of the material layers are used to determine a duration of time for the final purge sub-cycle that follows each performance of the ALD process.

For example, in accordance with some embodiments discussed herein, the ALD process may be a portion of a processing step to form a mask for subsequent patterning of one or more layers on a semiconductor substrate and/or of the semiconductor substrate itself. Some embodiments described herein are in the context of self-aligned double patterning (SADP), and a person having ordinary skill in the art will readily understand modifications to extend etching described herein to other patterning techniques, such as self-aligned quadruple patterning (SAQP) or the like. The SADP process described herein includes forming a metal oxide layer (e.g., titanium oxide) using an ALD process with a viscous precursor (e.g., a titanium precursor). As discussed further, other material layers using an ALD process with a viscous precursor are within the scope of other embodiments and may be performed in other contexts, such as forming gate spacers on gate stacks, forming recesses in substrates such as in dielectric layers, and other contexts. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 7 and 14 through 17 illustrate cross-sectional views of respective intermediate structures during an example method for forming conductive features in a dielectric layer using, for example, a self-aligned double patterning (SADP) technique, in accordance with some embodiments. FIG. 1 illustrates a dielectric layer 22 over a semiconductor substrate 20. The semiconductor substrate 20 may be or include a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

Various devices may be on the semiconductor substrate 20. For example, the semiconductor substrate 20 may include Field Effect Transistors (FETs), such as Fin FETs (FinFETs), planar FETs, gate all around FETs (GAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Etching described herein may be used in the processing to form and/or to interconnect the devices to form an integrated circuit. The integrated circuit can be any circuit, such as for an Application Specific Integrated Circuit (ASIC), a processor, memory, or other circuit.

The dielectric layer 22 is above the semiconductor substrate 20. The dielectric layer 22 may be directly on the semiconductor substrate 20, or any number of other layers may be disposed between the dielectric layer 22 and the semiconductor substrate 20. For example, the dielectric layer 22 may be or include an Inter-Layer Dielectric (ILD) or an Inter-Metal Dielectric (IMD). The dielectric layer 22, for example, may be or comprise a low-k dielectric having a k-value less than about 4.0, such as about 2.0 or even less. In some examples, the dielectric layer 22 comprises phosphosilicate glass (PSG), borophosphosilicate glass (BPSG), fluorosilicate glass (FSG), $SiO_xC_y$, Spin-On-Glass, Spin-On-Polymers, silicon carbon material, a compound thereof, a composite thereof, or a combination thereof. The dielectric layer 22 may be deposited using a Chemical Vapor Deposition (CVD), such as Plasma Enhanced CVD (PECVD) or Flowable CVD (FCVD); spin-on coating; or another deposition technique. In some examples, a Chemical Mechanical Planarization (CMP) or another planarization process may be performed to planarize the top surface of dielectric layer 22.

A mask stack is above the dielectric layer 22. The mask stack includes a first mask sub-layer 24, a second mask sub-layer 26, and a third mask sub-layer 28. In other examples, the mask stack may be or include one layer or any number of different layers. The first mask sub-layer 24 is above the dielectric layer 22. The second mask sub-layer 26 is above the first mask sub-layer 24. The third mask sub-layer 28 is above the second mask sub-layer 26.

The first mask sub-layer 24 may be or comprise an Anti-Reflective Coating (ARC), such as a Nitrogen-Free ARC (NFARC) (e.g., a silicon-rich oxide (SRO)), or the like. The second mask sub-layer 26 may be or comprise a nitride layer, such as titanium nitride (TiN), silicon nitride (SiN), tantalum nitride (TaN), the like, or a combination thereof. The third mask sub-layer 28 may be or comprise an oxide layer, such as tetraethylorthosilicate (TEOS), the like, or a combination thereof. The sub-layers of the mask stack (e.g., the first mask sub-layer 24, the second mask sub-layer 26, and the third mask sub-layer 28) may each be formed using CVD, Physical Vapor Deposition (PVD), Atomic Layer Deposition (ALD), or another deposition technique.

A mandrel layer 30 is above the mask stack (e.g., above the third mask sub-layer 28). The mandrel layer 30 may be or comprise a silicon layer, such as an amorphous silicon layer, the like, or a combination thereof. The mandrel layer 30 may be formed using CVD, PVD, ALD, or another deposition technique. The mandrel layer 30 can have a thickness in a range from about 30 nm to about 70 nm.

In subsequent figures, the semiconductor substrate 20 may be omitted to avoid obscuring features illustrated in those figures. A person having ordinary skill in the art will readily understand that the semiconductor substrate 20 is nevertheless present in the structures illustrated in those figures.

Figure 2:
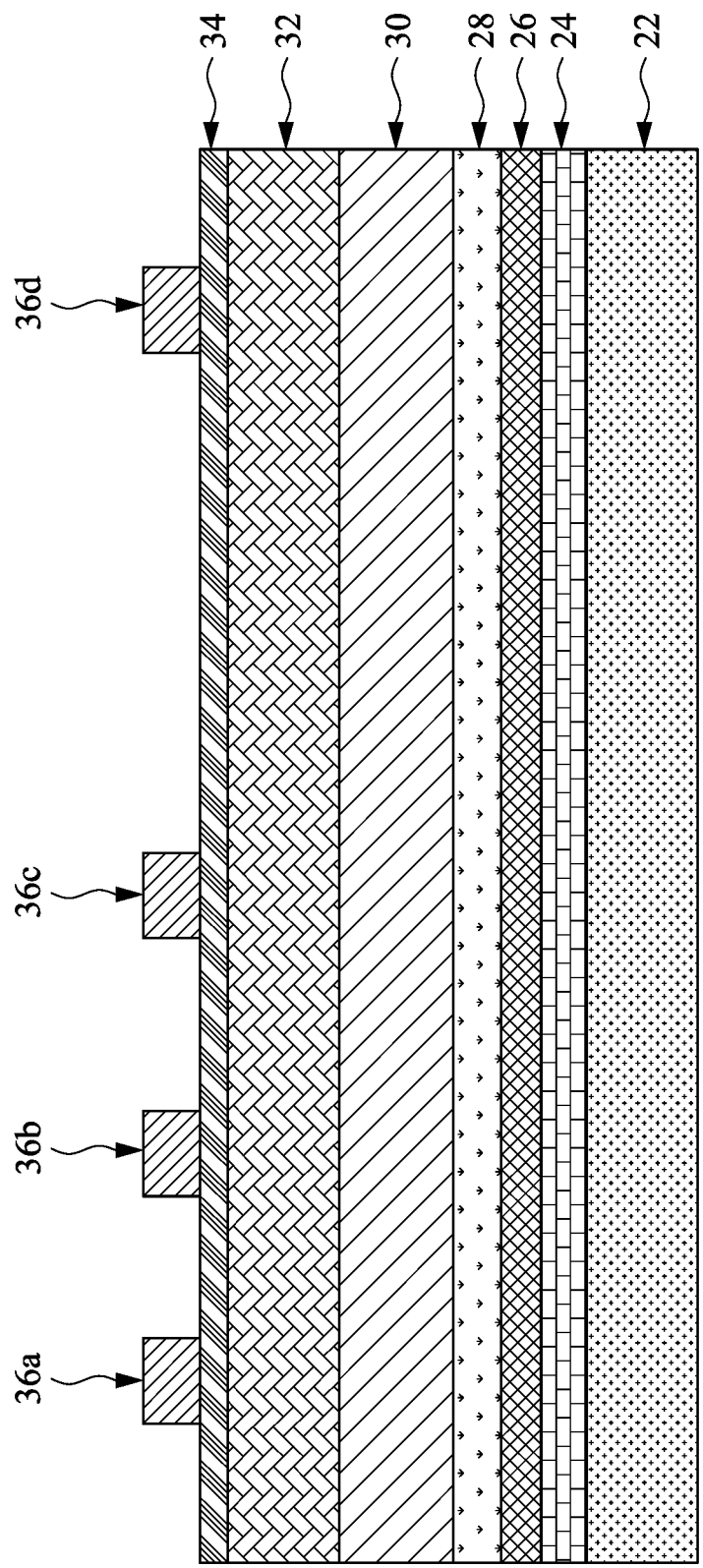

FIG. 2 illustrates the intermediate structure of FIG. 1 after further processing. A bottom layer 32 (e.g., a sacrificial layer) is formed above the mandrel layer 30. The bottom layer 32 may be or comprise a hard mask material, such as a carbon-containing material, and may be formed using spin-on coating, CVD, PVD, ALD, or another deposition technique. In an example, the bottom layer 32 is a polymer material, such as an oxide, formed by spin-on coating. The bottom layer 32 can have a thickness in a range from about 50 nm to about 150 nm.

A middle layer 34 (e.g., a sacrificial layer) is formed above the bottom layer 32. The middle layer 34 may be or comprise another mask material, such as a carbon-containing material like silicon oxycarbide (SiOC), and may be formed using CVD, PVD, ALD, or another deposition technique. In an example, the middle layer 34 is SiOC. The middle layer 34 can have a thickness in a range from about 10 nm to about 35 nm.

A photo resist is formed above the middle layer 34, such as by using spin-on coating, and is patterned by exposing the photo resist to light using an appropriate photomask. Exposed or unexposed portions of the photo resist may then be removed depending on whether a positive or negative resist is used. Patterned photo resist portions 36a-d remain above the middle layer 34.

Figure 3:
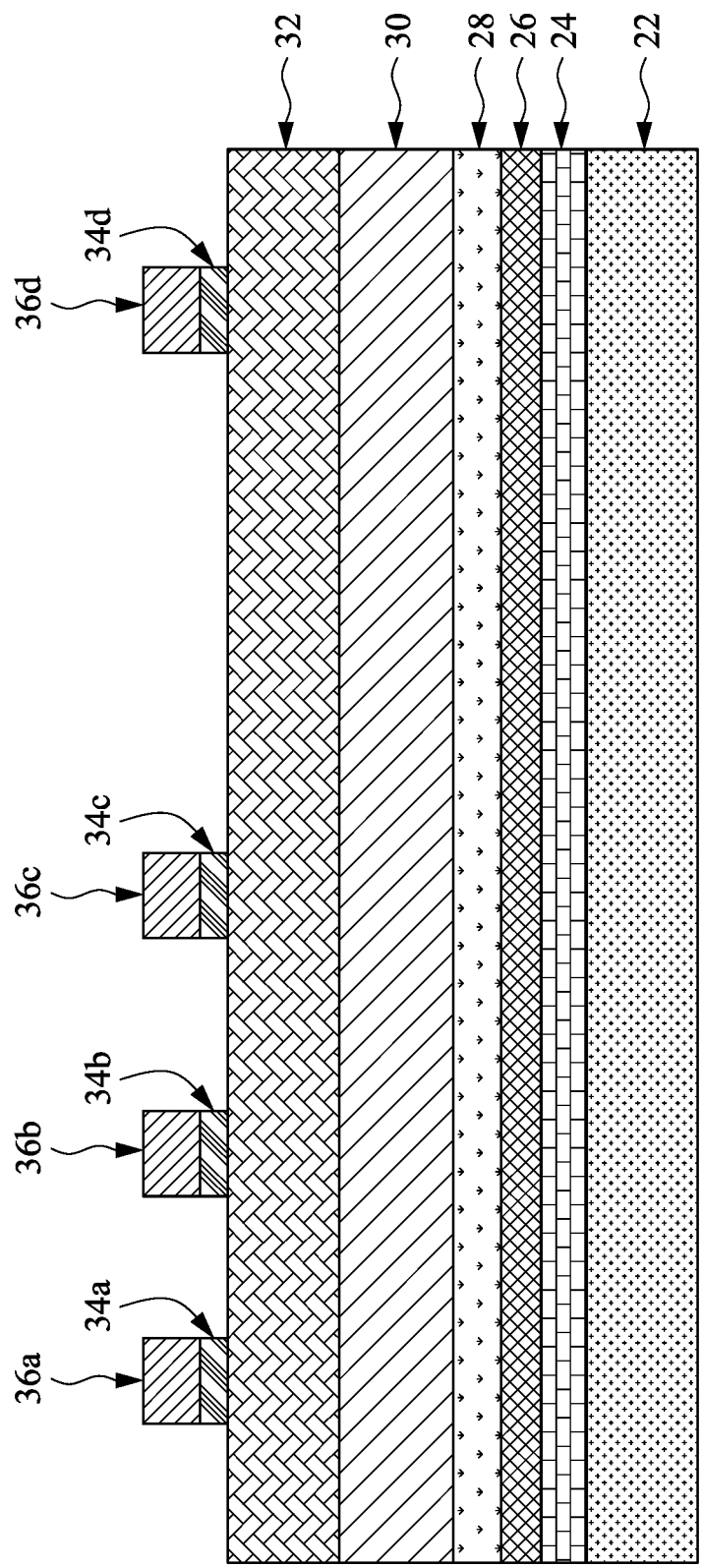

FIG. 3 illustrates the intermediate structure of FIG. 2 after further processing. An etch process is performed that transfers the pattern of the patterned photo resist portions 36a-d to the underlying middle layer 34 to form patterned middle layer portions 34a-d corresponding to the patterned photo resist portions 36a-d. The etch process can be any suitable etch process, such as a reactive ion etch (RIE), neutral beam etch (NBE), the like, or a combination thereof. The etch process can be a dry etch process that uses, for example, a gas comprising carbon tetrafluoride ($CF_4$) and fluoroform ($CHF_3$). A ratio of the flow rate of the carbon tetrafluoride ($CF_4$) to a flow rate of the fluoroform ($CHF_3$) can be in a range from about 0.2 to about 10, such as from about 1 to about 3.5. Subsequently, the patterned photo resist portions 36a-d may be removed in an ashing and/or wet strip processes, for example.

Figure 4:
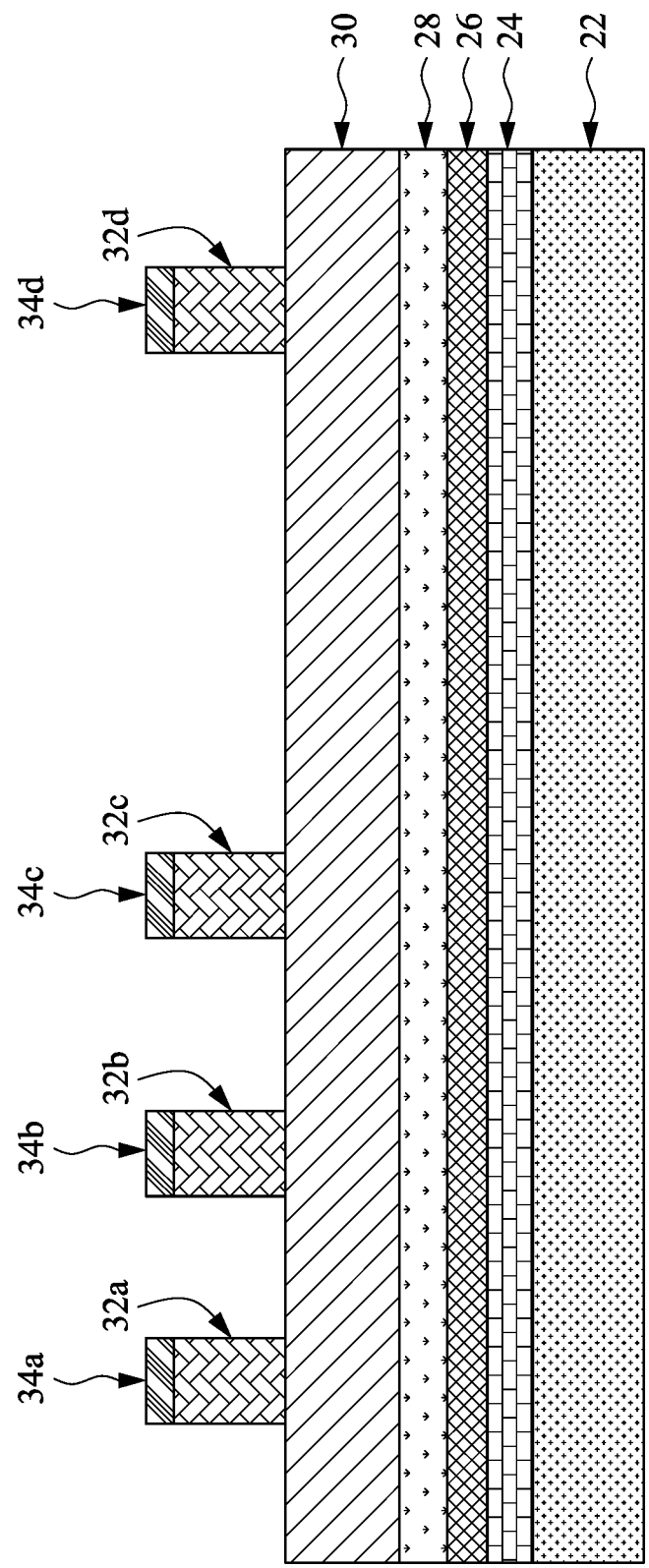

FIG. 4 illustrates the intermediate structure of FIG. 3 after further processing. An etch process is performed that transfers the pattern of the patterned middle layer portions 34a-d to the underlying bottom layer 32 to form patterned bottom layer portions 32a-d corresponding to the patterned middle layer portions 34a-d. The etch process can be any suitable etch process, such as RIE, NBE, the like, or a combination thereof. The etch process can be a dry etch process that uses, for example, a gas comprising oxygen ($O_2$) and chlorine ($Cl_2$). A ratio of the flow rate of the oxygen ($O_2$) to a flow rate of the chlorine ($Cl_2$) can be in a range from about 0.3 to about 4.

Figure 5:
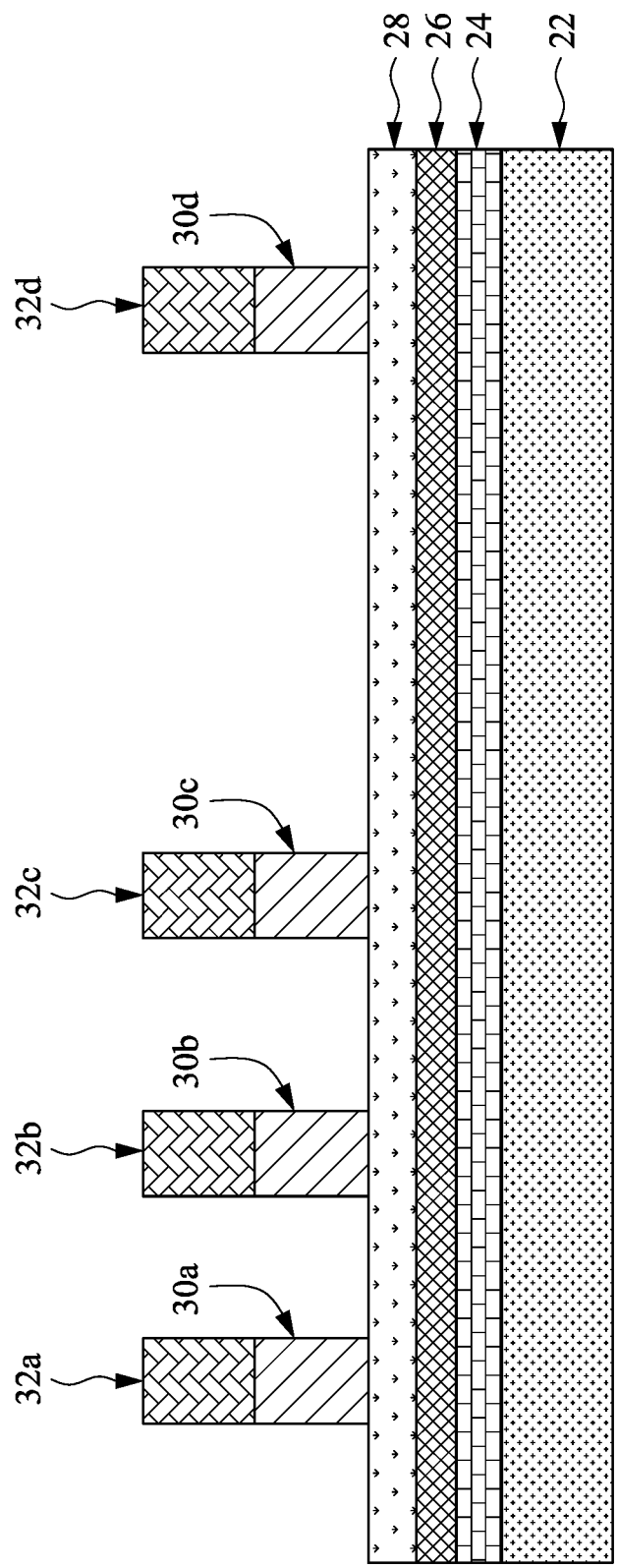

FIG. 5 illustrates the intermediate structure of FIG. 4 after further processing. One or more etch processes are performed that removes the patterned middle layer portions 34a-d and that recesses the pattern of the patterned bottom layer portions 32a-d to the underlying mandrel layer 30 to form patterned mandrels 30a-d corresponding to the patterned bottom layer portions 32a-d. The etch processes can be any suitable etch process. For example, the etch processes can be a plasma-based etch, such as an RIE, the like or a combination thereof. A first etch process can remove the patterned middle layer portions 34a-d and recess the mandrel layer 30, and can be a dry etch process that uses, for example, a gas comprising carbon tetrafluoride ($CF_4$) and fluoroform ($CHF_3$). A ratio of the flow rate of the carbon tetrafluoride ($CF_4$) to a flow rate of the fluoroform ($CHF_3$) can be in a range from about 0.2 to about 10, such as from about 1 to about 3.5. A second etch process can pattern the mandrel layer 30 and can be a dry etch process that uses, for example, a gas comprising one or more of carbon tetrafluoride ($CF_4$), chlorine ($Cl_2$), hydrogen bromide (HBr), or the like. For example, the dry etch process can use hydrogen bromide (HBr); a combination of carbon tetrafluoride ($CF_4$), chlorine ($Cl_2$), and hydrogen bromide (HBr); a combination of chlorine ($Cl_2$) and hydrogen bromide (HBr); and/or a combination of carbon tetrafluoride ($CF_4$) and chlorine ($Cl_2$). Oxygen ($O_2$) may also be used in the dry etch process, which may enhance selectivity of the etch process.

Figure 6:
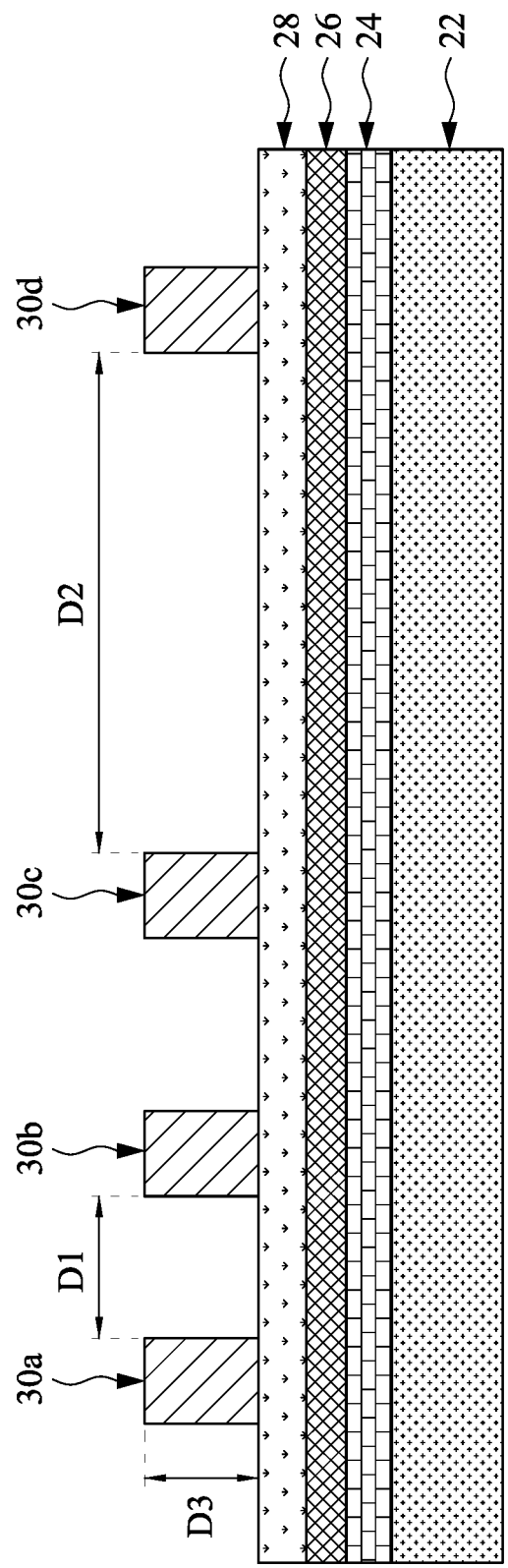

FIG. 6 illustrates the intermediate structure of FIG. 5 after further processing. An ash and/or etch process selective to the material of the bottom layer 32 is performed to remove the remaining patterned bottom layer portions 32a-d. The ash and/or etch process may be a plasma-based process. For example, the plasma-based process may be an oxygen ($O_2$) dry etch plasma. Patterned mandrels 30a-d remain above the mask stack.

A first dimension D1 is between facing sidewalls of neighboring patterned mandrels 30a and 30b, and a second dimension D2 is between facing sidewalls of neighboring patterned mandrels 30c and 30d. In some examples, the first dimension D1 is a smallest dimension between neighboring pairs of the patterned mandrels 30a-d, while the second dimension D2 is a largest dimension between neighboring pairs of the patterned mandrels 30a-d. Hence, the second dimension D2 is greater than the first dimension D1. In some examples, the second dimension D2 can be at least 3 times larger than the first dimension D1. In some examples, the first dimension D1 can be in a range from about 20 nm to about 50 nm, and the second dimension D2 can be in a range from about 50 nm to about 150 nm.

Further, the patterned mandrels 30a-d have a thickness of a third dimension D3, which may be in a range from about 30 nm to about 70 nm. The third dimension D3 may be or correspond to the thickness of the mandrel layer 30 as deposited as described with respect to FIG. 1, although, in some examples, the third dimension D3 may be less than the thickness of the mandrel layer 30 as deposited due to loss resulting from one or more etch processes. In some examples, a first aspect ratio AR1 of a smallest spacing between neighboring pairs of the patterned mandrels 30a-d (e.g., a ratio of the third dimension D3 to the first dimension D1 in the illustrated example of FIG. 6) can be greater than about 0.8 (e.g., and more particularly, greater than about 1.5), such as in a range from about 0.8 to about 4. In some examples, a second aspect ratio AR2 of a largest spacing between neighboring pairs of the patterned mandrels 30a-d (e.g., a ratio of the third dimension D3 to the second dimension D2 in the illustrated example of FIG. 6) can be less than about 1.2 (e.g., and more particularly, less than about 0.6), such as in a range from about 0.1 to about 1.2. In some examples, the first aspect ratio AR1 can be at least 2 times larger than the second aspect ratio AR2.

Figure 7:
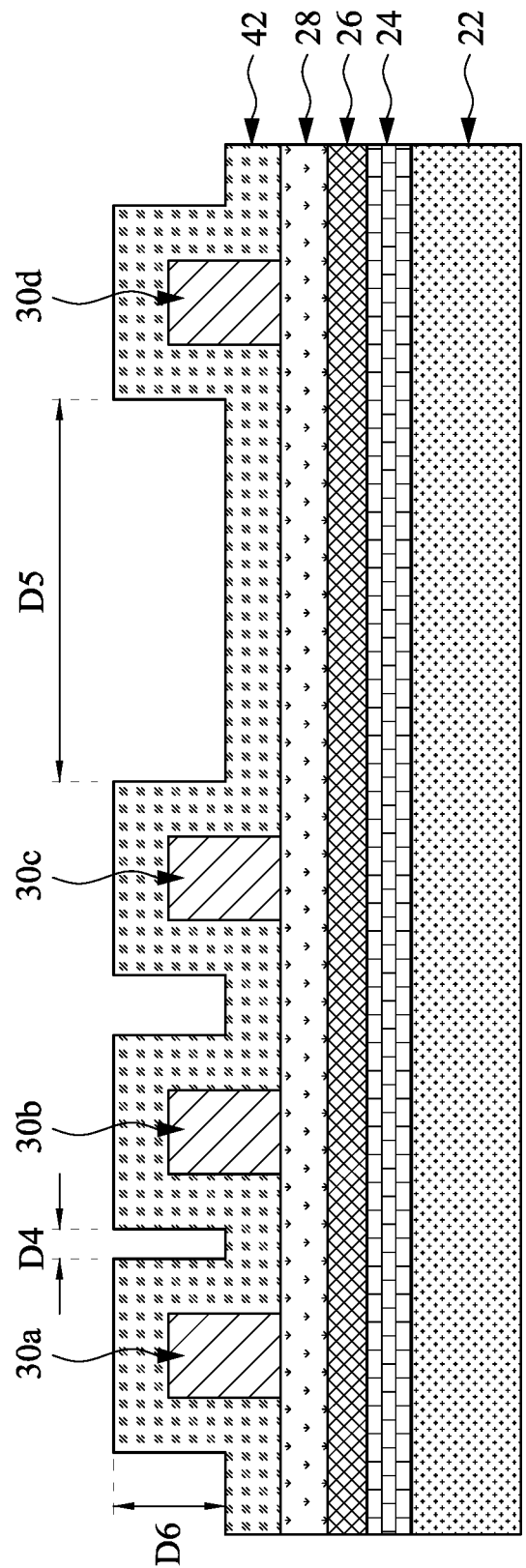

FIG. 7 illustrates the intermediate structure of FIG. 6 after further processing. A spacer layer 42 is formed on the patterned mandrels 30a-d and above the mask stack. The spacer layer 42 serves as the exemplary processing step whose recipe may be determined or adjusted based on a pre-fabrication methodology described below in connection with FIGS. 8A through 13. The spacer layer 42 is formed conformally on the patterned mandrels 30a-d. The spacer layer 42 may comprise, for example, titanium oxide, titanium nitride, silicon nitride, silicon oxide, or another acceptable material, and may be formed using ALD, CVD, or another deposition technique. The spacer layer 42 may have a thickness in a range from about 5 nm to about 23 nm, and more particularly, from about 9 nm to about 20 nm. For the sake of simplicity, the spacer layer 42 may be discussed henceforth as being formed to a specified thickness of about 14.5 nm.

The ALD process to form the spacer layer 42 includes a plurality of cycles of flowing process materials (e.g., a specified number of cycles to reach the specified thickness), wherein each cycle includes precursor sub-cycles (e.g., a first precursor sub-cycle and a second precursor sub-cycle) as well as a purge sub-cycle following each precursor sub-cycle. For example, to form the spacer layer 42 comprising titanium oxide, the first precursor sub-cycles may be an oxygen precursor sub-cycle, the second precursor sub-cycle may be a titanium precursor sub-cycle, and the purge sub-cycle may include an inert gas. The inert gas may include argon, nitrogen ($N_2$), the like, combinations thereof, or any suitable material.

In a more particular embodiment, the spacer layer 42 comprises titanium oxide and is formed using an ALD process with an oxygen precursor and a titanium precursor. The oxygen precursor may comprise $O_2$, $O_3$, $H_2O$, the like, or any suitable oxygen source. The titanium precursor may comprise tetrakis(dimethylamido)titanium ((($CH_3)_2N)_4Ti$, TDMAT), titanium isopropoxide ((($CH_3)_2O)_4Ti$, TTIP), the like, or any suitable titanium source to be used during the titanium sub-cycles. The titanium precursor, such as one of the titanium precursors listed above, may be a viscous material having a viscosity of between about 2.10 centipoise (cps) and about 2.30 cps.

In other embodiments, the spacer layer 42 comprises silicon nitride and is formed using an ALD process with a nitrogen precursor and a silicon precursor. The nitrogen precursor may comprise $N_2$, $NH_3$, $H_2$, the like, or any suitable nitrogen source. The silicon precursor may comprise N-(diethylaminosilyl)-N-ethylethanamine (($CH_3CH_2)_2NSiH_2N(CH_2CH_3)_2$, SAM24), silane, chlorosilane, dichlorosilane, hexachlorodisilane, $SiH(N(CH_3)_2)_3$, $SiH_2(NH^tBu)_2$, $C_9H_{29}N_3Si_3$, $C_6H_{17}NSi$, $C_9H_{25}N_3Si$, $C_8H_{22}N_2Si$, $(SiH_3)_3N$, $(SiH_3)_4Si$, the like, or any suitable silicon source. For example, the spacer layer 42 comprising silicon nitride may be formed using process parameters listed below in Table 1.

TABLE 1

| Precursor | Plasma Gas | Reactor/Type | Deposition Temp. (° C.) | GPC (Å/Cycle) | Refractive Index |
|---|---|---|---|---|---|
| $SiH_3Cl$ | $NH_3$ | Radical/— | 400 | — | — |
| $SiH_2Cl_2$ | $NH_3$ | Remote/MW | 250-400 | 0.91 | 1.6 |
| $SiH_2Cl_2$ | $NH_3$ | Remote/— | 350-400 | −1.0 | — |
| $SiH_2Cl_2$ | $NH_3$ | Remote/CCP | 595 | — | — |
| $SiH_2Cl_2$ | $NH_3$ | Radical/— | 500 | — | — |
| $SiH_2Cl_2$ | $NH_3$ | —/— | 350-500 | — | — |
| $SiH_2Cl_2$ | $NH_3$ | Remote/ICP | 350 | 0.24 | — |
| $Si_2Cl_6$ | $NH_3$ | Direct/CCP | 350-450 | 1.2 | 1.9 |
| $Si_2Cl_6$ | $NH_3$ | —/— | 200-500 | 0.31-0.38 | — |
| $SiH(N(CH_3)_2)_3$ | $N_2/H_2$ | Remote/ICP | 350 | 0.4 | 1.95 |
| $SiH(N(CH_3)_2)_3$ | $N_2$ | Remote/ICP | 350 | 0.11-0.12 | — |
| $SiH_2(NH^tBu)_2$ | $N_2$ | Remote/ICP | 100-500 | 0.15-0.93 | 1.63-1.96 |
| $C_9H_{29}N_3Si_3$ | $N_2$ | Direct/CCP | 250-400 | 0.36 | 1.93 |
| $C_6H_{17}NSi$ | $NH_3$ | Direct/CCP | 325 | 0.35-0.7 | 1.7-1.8 |
| $C_9H_{25}N_3Si$ | $NH_3$ | Direct/CCP | 325 | <0.1 | — |
| $C_9H_{23}N_3Si$ | $NH_3$ | —/— | 270 | −0.07 | — |
| $C_8H_{22}N_2Si$ | $N_2/H_2$ | Remote/ICP | — | — | — |
| $SiH_4$ | $N_2$ | Direct/CCP | 250-400 | 0.25-2.5 | 1.7-1.85 |
| $SiH_4$ | $N_2/H_2$ | Direct/CCP | 350 | 0.1 | — |
| $(SiH_3)_3N$ | $N_2/H_2$ | Direct/— | 300-400 | 1.4-2.1 | 2.04-2.16 |
| $(SiH_3)_3N$ | $NH_3$ | Remote/ICP | 150-350 | 0.65 | 1.65-1.80 |
| $(SiH_3)_3N$ | $N_2$ | Direct/CCP | 250-300 | 1.2 | 2.07-2.2 |
| $(SiH_3)_4Si$ | $N_2$ | Direct/CCP | 250-300 | 1.4 | 2.07-2.14 |

In yet other embodiments, the spacer layer 42 comprises silicon oxide and is formed using an ALD process with an oxygen precursor and a silicon precursor. The oxygen precursor may comprise $O_2$, $O_3$, $H_2O$, the like, or any suitable oxygen source. The silicon precursor may comprise dimethylaminosilne (DMAS, adsorption energy $\Delta E_{AD}$=18.8 kcal/mol), diethylaminosilane (DEAS, $\Delta E_{AD}$=19.5 kcal/mol), dipropylaminosilane (DPAS, $\Delta E_{AD}$=17.8 kcal/mol), di-isopropylaminosilane (DIPAS, $\Delta E_{AD}$=18.8 kcal/mol), di(sec-butylamino)silane (DSBAS, $\Delta E_{AD}$=17.7 kcal/mol), di-t-butylaminosilane (DTBAS, $\Delta E_{AD}$=16.2 kcal/mol), the like, or any suitable silicon source.

A fourth dimension D4 is between facing sidewalls of the spacer layer 42 on neighboring patterned mandrels 30a and 30b, and a fifth dimension D5 is between facing sidewalls of the spacer layer 42 on neighboring patterned mandrels 30c and 30d. In some examples, the fourth dimension D4 is a smallest dimension between facing sidewalls of the spacer layer 42 on neighboring pairs of the patterned mandrels 30a-d, while the fifth dimension D5 is a largest dimension between facing sidewalls of the spacer layer 42 on neighboring pairs of the patterned mandrels 30a-d. Hence, the fifth dimension D5 is greater than the fourth dimension D4. In some examples, the fifth dimension D5 can be at least 6 times larger than the fourth dimension D4. In some examples, the fourth dimension D4 can be in a range from about 7 nm to about 35 nm, and the fifth dimension D5 can be in a range from about 20 nm to about 135 nm.

Further, a sixth dimension D6 may be between an upper surface of a horizontal portion of the spacer layer 42 between neighboring pairs of the patterned mandrels 30a-d and an upper surface of a horizontal portion of the spacer layer 42 over a corresponding patterned mandrel 30a-d. Generally, the sixth dimension D6 may be or correspond to the third dimension D3. The sixth dimension D6 may be in a range from about 30 nm to about 70 nm. In some examples, a third aspect ratio AR3 of a smallest spacing between facing sidewalls of the spacer layer 42 on neighboring pairs of the patterned mandrels 30a-d (e.g., a ratio of the sixth dimension D6 to the fourth dimension D4 in the illustrated example of FIG. 7) can be greater than about 2 (e.g., and more particularly, greater than about 4), such as in a range from about 2 to about 8. In some examples, a fourth aspect ratio AR4 of a largest spacing between facing sidewalls of the spacer layer 42 on neighboring pairs of the patterned mandrels 30a-d (e.g., a ratio of the sixth dimension D6 to the fifth dimension D5 in the illustrated example of FIG. 7) can be less than about 1.0 (e.g., and more particularly, less than about 0.5), such as in a range from about 0.1 to about 1.0. In some examples, the third aspect ratio AR3 can be at least 8 times larger than the fourth aspect ratio AR4.

FIGS. 8A through 8F illustrate schematic diagrams of a deposition system 200, which may be used to form the spacer layer 42 using an ALD process. For the sake of simplicity, the following discussion of the deposition system 200 may refer to the spacer layer 42 as comprising titanium oxide and being formed with TDMAT as the titanium precursor. However, the deposition system 200 may use other precursors to form a material of the same or a different composition.

As discussed above, the ALD process may include a plurality of cycles with each cycle including an oxygen sub-cycle, a purge sub-cycle, a titanium sub-cycle, and a purge sub-cycle. During the oxygen sub-cycles, the oxygen precursor reacts with an exposed surface of the structure to form an oxygen-rich sub-layer of the spacer layer 42. During the titanium sub-cycles, the titanium precursor reacts with an exposed surface of the structure to form a titanium-rich sub-layer of the spacer layer 42. During the purge sub-cycles, the inert gas may purge portions of the system of all or most of remaining precursors (e.g., the oxygen precursor and/or the titanium precursor).

The deposition system 200 comprises an inert gas delivery system 204, a titanium precursor delivery system 205, and an oxygen precursor delivery system 206 configured to deliver the process materials (e.g., the inert gas, the titanium precursor, and the oxygen precursor, respectively) through gas lines 216 to a deposition chamber 203. The process materials are delivered through various portions of the gas lines 216 to a precursor gas controller 213, which then delivers the process materials through a final portion of the gas lines 216 (e.g., a manifold) and into the deposition chamber 203.

The inert gas delivery system 204 includes an inert gas supply 211 to store the inert gas and a flow controller 212. The inert gas supply 211 may be a vessel, such as a gas storage tank, that is located either locally to the deposition chamber 203 or else may be located remotely from the deposition chamber 203. In another embodiment, the inert gas supply 211 may be a facility that independently prepares and delivers the inert gas to the flow controller 212. Any suitable source for the inert gas may be utilized as the inert gas supply 211, and all such sources are fully intended to be included within the scope of the embodiments. The flow controller 212 may be utilized to control the flow of the inert gas and may include, for example, a proportional valve, a modulating valve, a needle valve, a pressure regulator, a mass flow controller, combinations of these, or the like. However, any suitable method for controlling and regulating the flow of the inert gas may be utilized, and all such methods are fully intended to be included within the scope of the embodiments.

The titanium precursor delivery system 205 includes a bottle 207 to store, for example, a viscous precursor (e.g., the titanium precursor) and inlet and outlet valves 316 and 318, respectively. The bottle 207 stores the titanium precursor in both liquid and gaseous phases. Although not specifically illustrated, a titanium supply vessel (e.g., a storage tank) may store the titanium precursor before delivering it to the bottle 207. The inlet valve 316 may be utilized to receive the flow of the inert gas into the titanium precursor delivery system 205, and the outlet valve 318 may be utilized to allow the inert gas to carry the titanium precursor from the titanium precursor delivery system 205 in the gas lines 216. In other embodiments not illustrated, the titanium precursor delivery system 205 may further include a flow controller which may include, for example, a proportional valve, a modulating valve, a needle valve, a pressure regulator, a mass flow controller, combinations of these, or the like. However, any suitable method for controlling and regulating the flow of the titanium precursor may be utilized, and all such methods are fully intended to be included within the scope of the embodiments.

The oxygen precursor delivery system 206 may include a gas supply 208 to store the oxygen precursor and a flow controller 210. The gas supply 208 may be a vessel, such as a gas storage tank, that is located either locally to the deposition chamber 203 or else may be located remotely from the deposition chamber 203. In another embodiment, the gas supply 208 may be a facility that independently prepares and delivers the oxygen precursor to the flow controller 210. Any suitable source for the oxygen precursor may be utilized as the gas supply 208, and all such sources are fully intended to be included within the scope of the embodiments. The flow controller 210 may be utilized to control the flow of the oxygen precursor and may include, for example, a proportional valve, a modulating valve, a needle valve, a pressure regulator, a mass flow controller, combinations of these, or the like. However, any suitable method for controlling and regulating the flow of the oxygen precursor may be utilized, and all such methods are fully intended to be included within the scope of the embodiments.

As illustrated, the deposition system 200 may be configured to deliver the inert gas from the inert gas delivery system 204 to the titanium precursor delivery system 205 in order to help carry the gaseous phase of the titanium precursor from the bottle 207 to the precursor gas controller 213 and, eventually, to the deposition chamber 203. In addition, the deposition system 200 may be further configured so that the inert gas bypasses the titanium precursor delivery system 205 and is delivered to the precursor gas controller 213 and, eventually, to the deposition chamber 203.

As discussed above, the titanium precursor delivery system 205 may be utilized in conjunction with the inert gas delivery system 204 to deliver the titanium precursor with the inert gas to the deposition chamber 203. By coordinating the opening and closing of valves 308/310/312/316/318/320, the inert gas may be delivered from the inert gas supply 211 to the titanium precursor delivery system 205. The precursor gas controller 213 may be utilized to control the flow of the titanium precursor and the inert gas to the deposition chamber 203, thereby also helping to control the pressure within the deposition chamber 203.

As discussed above, the deposition system 200 may be further configured so that the inert gas from the inert gas delivery system 204 bypasses the titanium precursor delivery system 205. By coordinating the opening and closing of the valves 308/310/312/316/318/320, the inert gas may be delivered from the inert gas supply 211 to the deposition chamber 203. As a result, the titanium precursor delivery system 205 may be removed from the process, either physically or functionally, so that other process materials may be delivered to the deposition chamber 203 or so that purging, maintenance, replacing the precursor material (e.g., the titanium precursor), or other work may be performed on the titanium precursor delivery system 205 while it is not actively connected to the rest of the deposition system 200.

The bottle 207 of the titanium precursor delivery system 205 may comprise a vapor region and a raw material region. In some embodiments, the liquid phase of the titanium precursor (e.g., TDMAT) is placed into or delivered to the raw material region of the bottle 207. Once in the raw material region of the bottle 207, thermodynamic equilibrium may be used to drive portions of the liquid phase of the titanium precursor into the gaseous phase thereby entering the vapor region. The gaseous phase of the titanium precursor in the vapor region may be passed through the flow controller 212, for example, with the assistance of the inert gas flowing from the inert gas delivery system 204 through the vapor region of the bottle 207 and around baffles (not shown) located within.

The bottle 207 may be any desired shape suitable for vaporizing (e.g., if stored in the liquid phase) or sublimating (e.g., if stored in the solid phase) the titanium precursor. Although not specifically illustrated, the bottle 207 may be in the shape of a cylinder, a hollow square tube, an octagonal shape, or the like. Furthermore, the bottle 207 may contain the process materials with a material that is inert to the various process materials. As such, the bottle 207 may comprise any suitable material that can withstand the chemistries and pressures involved in the process, such as steel, stainless steel, nickel, aluminum, alloys of these, combinations of these, or the like.

In some embodiments, after the liquid phase of, e.g., TDMAT is placed within the raw material region of the bottle 207, some of the TDMAT vaporizes to the gaseous phase and accumulates within the vapor region of the bottle 207. As such, the gaseous phase of the TDMAT becomes a process material for the inert gas to carry to the deposition chamber 203, as described in greater detail below.

Although not specifically illustrated, a heater may be placed around the bottle 207 to adjust and maintain the thermodynamic equilibrium of the liquid and gaseous phases, including to help drive the TDMAT into the gaseous phase and into the vapor region of the bottle 207. The amount of the TDMAT that transfers to the desired gaseous phase and the rate at which it may be transferred to the gaseous phase is related to the thermodynamic equilibrium, which may be a function of the temperature of the gaseous and liquid phases.

As discussed above and additionally below, the inert gas supply 211, the titanium precursor delivery system 205, and the oxygen precursor delivery system 206 supply the desired process materials to the precursor gas controller 213. The precursor gas controller 213 connects and isolates the inert gas supply 211, the titanium precursor delivery system 205, and the oxygen precursor delivery system 206 from the deposition chamber 203 in order to deliver the desired process materials through the manifold of the gas lines 216 to the deposition chamber 203 at the necessary times to perform the desired sub-cycles (see FIGS. 8B through 8F). The precursor gas controller 213 may include such devices as valves, flow meters, sensors, and the like to control the delivery rates of each of the precursors, and may be controlled by instructions received from a control unit 215. For example, the control unit 215 may be any form of computer processor that can be used in an industrial setting for controlling process machines. The control unit 215 may comprise a processing unit, such as a desktop computer, a workstation, a laptop computer, or a dedicated unit customized for a particular application.

The deposition system 200 further includes a control unit 215 to control and coordinate a variety of the functions described above and otherwise utilized in the deposition system 200. For example, the control unit 215 may open and close valves (e.g., valves 308/310/312/314/316/318/320 and/or other valves in the deposition system 200 not specifically illustrated) so as to connect one or more of the inert gas delivery system 204, the titanium precursor delivery system 205, and/or the oxygen precursor delivery system 206 to the precursor gas controller and to the deposition chamber 203. The control unit 215 may also control the flow controllers 210/212, the precursor gas controller 213, and the heater for the bottle 207.

Figure 8A:
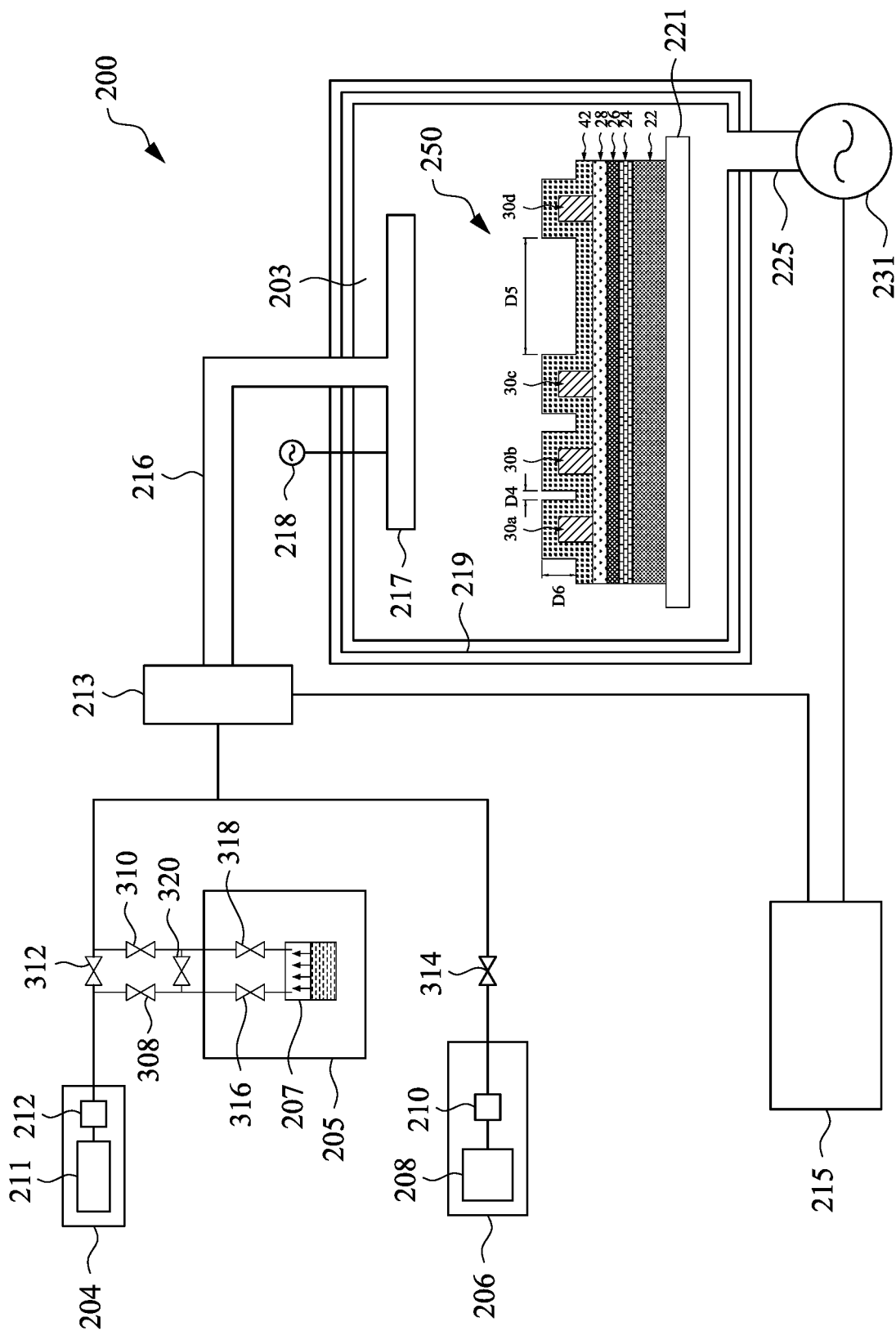
FIGS. 8A through 8F are schematic diagrams of an atomic layer deposition tool, in accordance with some embodiments.

As further illustrated in FIG. 8A, the deposition chamber 203 receives the process materials from the precursor gas controller 213 through the manifold of the gas lines 216. Near an entrance into the deposition chamber 203, the manifold connects to a showerhead 217, which may include or be attached to a plasma generator 218. The plasma generator 218 may be a radiofrequency (RF) or a microwave (MW) plasma generator, a transformer coupled plasma generator, or may include any suitable method of converting the process materials into plasma, such as inductively coupled plasma systems (ICP), capacitively coupled plasma (CCP) systems, magnetically enhanced reactive ion etching, electron cyclotron resonance, or the like, whether direct or remote. In other embodiments, a radical generator may be used instead of the plasma generator 218. The control unit 215 may signal the plasma generator 218 (or radical generator) to convert the process materials entering the deposition chamber 203 into plasma form (or radical form). The showerhead 217 may then be utilized to disperse the desired process materials (e.g., whether in plasma form or non-plasma form) throughout the deposition chamber 203. The showerhead 217 may be designed to evenly disperse the process materials in order to minimize undesired process conditions that may arise from uneven dispersal. For example, the showerhead 217 may have a circular design with openings dispersed evenly around the showerhead 217 to allow for the dispersal of the desired process materials into the deposition chamber 203.

However, as one of ordinary skill in the art will recognize, the introduction of the process materials to the deposition chamber 203 through a single showerhead 217 or through a single point of introduction as described above is intended to be illustrative only and is not intended to be limiting to the embodiments. Any number of separate and independent showerheads 217 or other openings to introduce the process materials into the deposition chamber 203 may be utilized. All such combinations of showerheads and other points of introduction are fully intended to be included within the scope of the embodiments.

The deposition chamber 203 may be any desired shape that may be suitable for dispersing the process materials. For example, the deposition chamber 203 may have a cylindrical sidewall and a bottom. However, the deposition chamber 203 is not limited to a cylindrical shape, and any other suitable shape, such as a hollow square tube, an octagonal shape, or the like, may be utilized. Furthermore, the deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the deposition chamber 203 a wafer 250 (e.g., the structure from FIG. 7) may be placed on a mounting platform 221 in order to position and control the wafer 250 during the deposition processes. The mounting platform 221 may include heating mechanisms in order to heat the wafer 250 during the deposition processes. Furthermore, while a single mounting platform 221 is illustrated, any number of mounting platforms 221 may additionally be included within the deposition chamber 203.

Additionally, the deposition chamber 203 and the mounting platform 221 may be part of a cluster tool system (not shown). The cluster tool system may be used in conjunction with an automated handling system in order to position and place the wafer 250 into the deposition chamber 203 prior to the deposition processes, position and hold the wafer 250 during the deposition processes, and remove the wafer 250 from the deposition chamber 203 after the deposition processes.

The deposition chamber 203 may also have an exhaust outlet 225 for exhaust gases to exit the deposition chamber 203. A vacuum pump 231 may be connected to the exhaust outlet 225 of the deposition chamber 203 in order to help evacuate the exhaust gases (e.g., remaining of the process materials and/or deposition or reaction byproducts). The vacuum pump 231, under control of the control unit 215, may also be utilized to reduce and control the pressure within the deposition chamber 203 to a desired pressure and may also be utilized to evacuate the process materials and deposition byproducts from the deposition chamber 203 in preparation for the introduction of the next process materials in a subsequent sub-cycle of the deposition process.

Figure 8C:
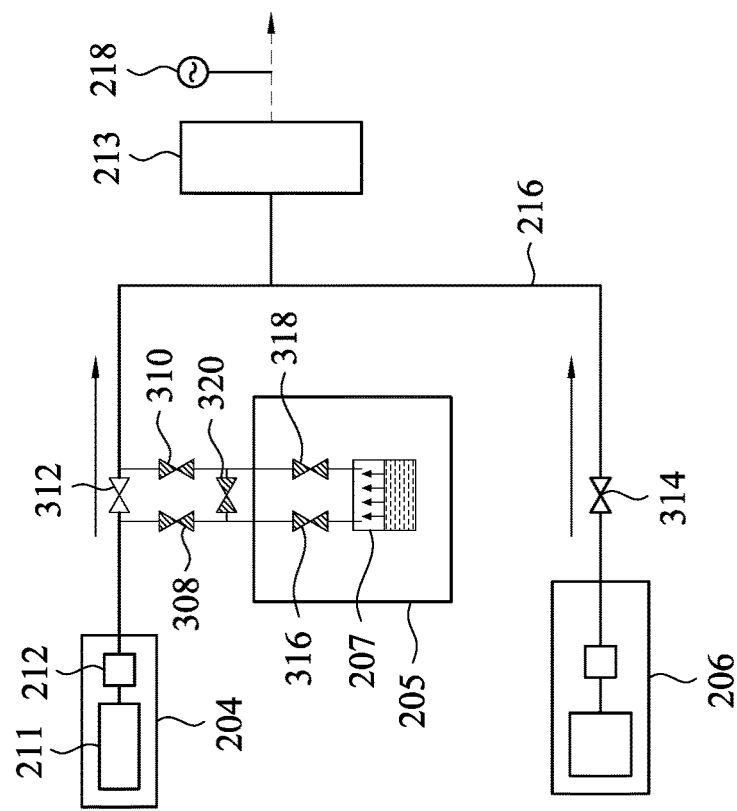
Figure 8B:
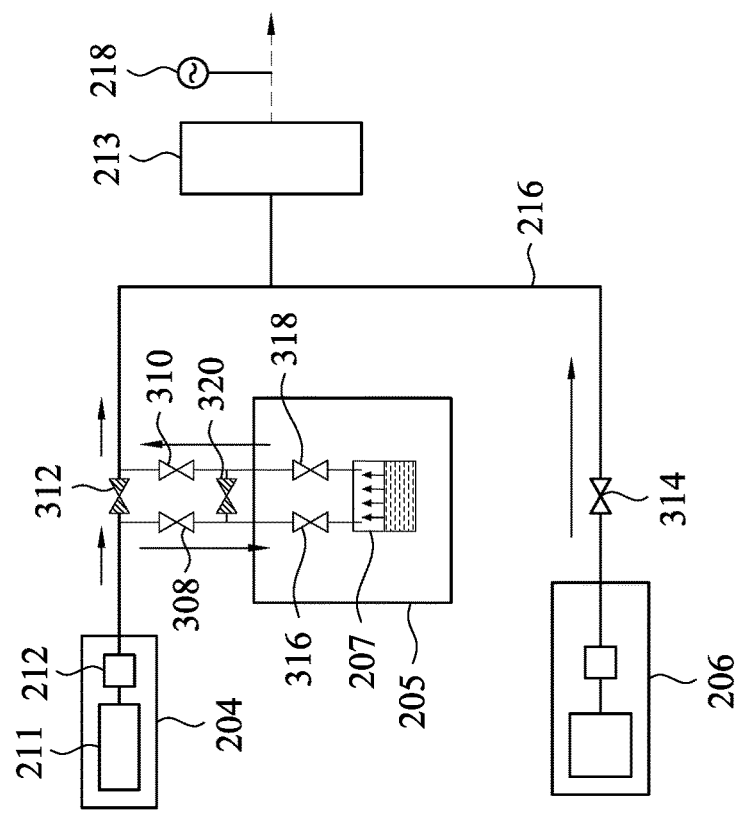
Figure 8E:
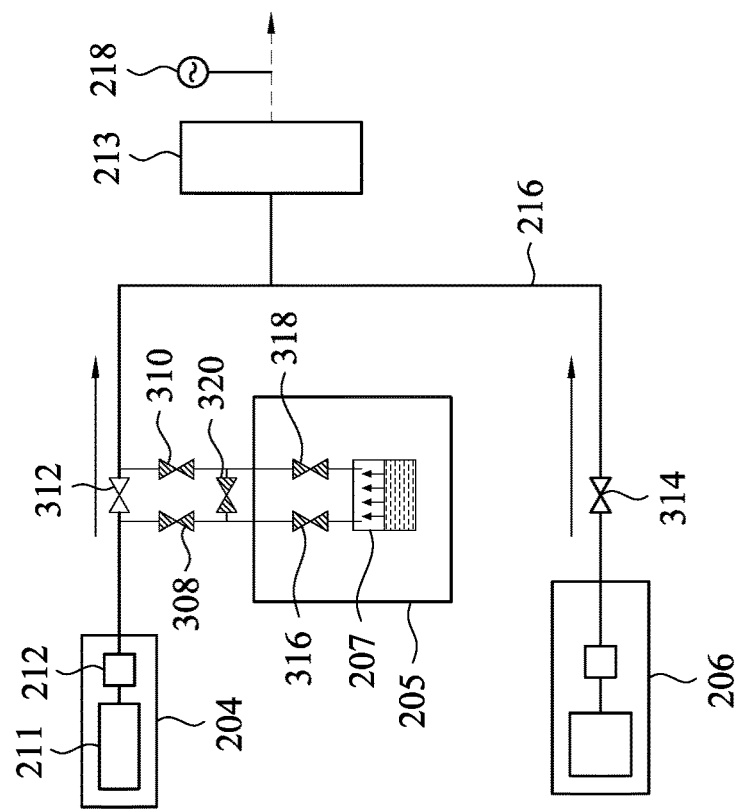

Referring to FIGS. 8B through 8E (each illustrating a portion of the deposition system 200 and excluding, e.g., the manifold of the gas lines 216 and the deposition chamber 203), performing the deposition process to form the spacer layer 42 over the wafer 250 may include a plurality of cycles, wherein each cycle comprises an oxygen sub-cycle (see FIG. 8B), a purge sub-cycle (see FIG. 8C), a titanium sub-cycle (see FIG. 8D), and another purge sub-cycle (see FIG. 8E). The cycles (e.g., the series of sub-cycles) are repeated for the specified number of cycles for the spacer layer 42 to be formed to the desired specifications, such as the specified thickness. In some embodiments, each cycle in the formation of the spacer layer 42 proceeds with a titanium sub-cycle (see FIG. 8B), a purge sub-cycle (see FIGS. 8C and 8E), an oxygen sub-cycle (see FIG. 8D), and another purge sub-cycle (see FIGS. 8C and 8E). In other embodiments, the order may be different or partial cycles may be included at the beginning and/or end of the formation process.

In FIG. 8B, the titanium sub-cycle may be performed as illustrated to form a titanium-rich (e.g., comprising TDMAT-based surface groups) sub-layer over the structure. During the titanium sub-cycle, the inert gas, titanium precursor, and oxygen precursor are flowed. For example, opening valves 308/310/316/318 and closing valves 312/320 will allow the inert gas to be delivered from the inert gas supply 211 to the titanium precursor delivery system 205 and carry the titanium precursor to the precursor gas controller 213 and, eventually, to the deposition chamber 203. In addition, during the titanium sub-cycle, the fourth valve 314 remains open for the oxygen precursor to be delivered to the precursor gas controller 213 and the deposition chamber 203, while the plasma generator 218 is off. The titanium sub-cycle may be performed at temperatures in the deposition chamber 203 of between about 150° C. and about 250° C., at pressures in the deposition chamber 203 of between about 1.5 Torr and about 2.5 Torr, and for a duration of between about 0.1 seconds and about 4 seconds.

In FIG. 8C, the purge sub-cycle may be performed as illustrated to purge portions of the gas lines 216 (e.g., including the manifold) and the deposition chamber 203 of the oxygen precursor and any remaining other process materials and byproducts. During the purge sub-cycle, the inert gas and the oxygen precursor are flowed, while the plasma generator 218 is off. For example, opening valve 312 and closing valves 308/310/314/316/318/320 will allow the inert gas to be delivered from the inert gas supply 211 to the precursor gas controller 213 and, eventually, to the deposition chamber 203. In addition, keeping valve 314 open allows oxygen to flow through the gas lines 216 and into the deposition chamber 203. The purge sub-cycle may be performed using a flowrate of argon of between about 1500 standard cubic centimeters per minute (sccm) and about 3500 sccm, at temperatures in the deposition chamber 203 of between about 150° C. and about 250° C., at pressures in the deposition chamber 203 of between about 1.5 Torr and about 2.5 Torr, and for a duration of between about 0.1 seconds and about 2 seconds.

Figure 8D:
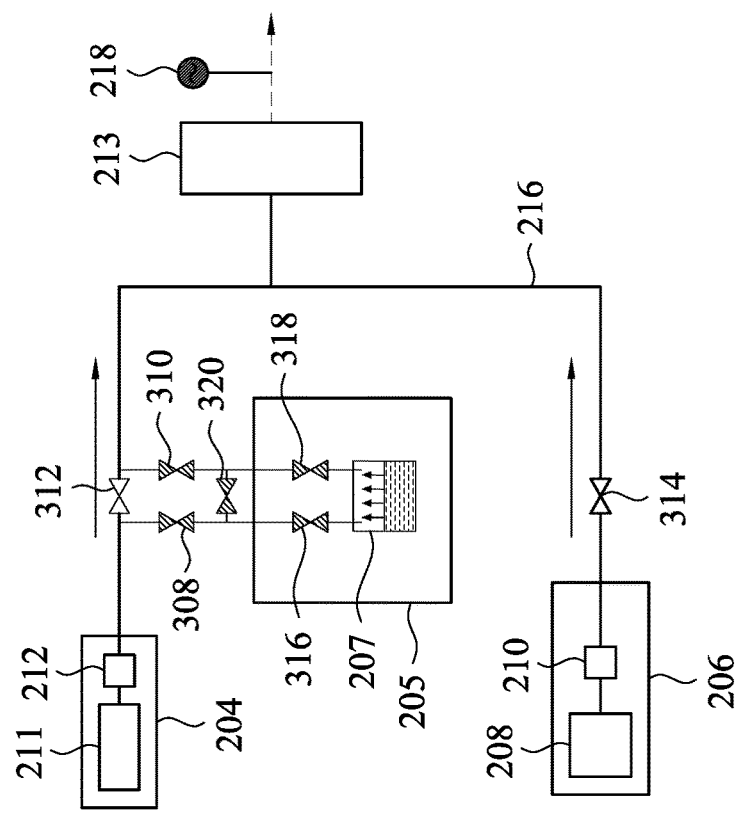

In FIG. 8D, the oxygen sub-cycle may be performed as illustrated to form an oxygen-rich (e.g., comprising oxygen-based and/or hydroxyl surface groups) sub-layer over the structure. During the oxygen sub-cycle, oxygen and the inert gas are flowed, and the plasma generator 218 is on and utilized to convert the process materials (e.g., the oxygen) into plasma. For example, closing valves 308/310 (and valves 316/318/320) while opening valve 312 allows the inert gas to flow through the gas lines 216 and into the deposition chamber 203. In addition, keeping valve 314 open allows oxygen to flow through the gas lines 216 and into the deposition chamber 203. The oxygen sub-cycle may be performed at temperatures in the deposition chamber 203 of between about 150° C. and about 250° C., at pressures in the deposition chamber 203 of between about 1.5 Torr and about 2.5 Torr, and for a duration of between about 0.1 seconds and about 2 seconds.

In FIG. 8E (and similarly as in FIG. 8C), the purge sub-cycle may be performed as illustrated to purge portions of the gas lines 216 (e.g., including the manifold) and the deposition chamber 203 of the titanium precursor and any remaining other process materials and byproducts. During the purge sub-cycle, the inert gas and the oxygen precursor are flowed, while the plasma generator 218 is off. For example, opening valve 312 and closing valves 308/310/314/316/318/320 will allow the inert gas to be delivered from the inert gas supply 211 to the precursor gas controller 213 and, eventually, to the deposition chamber 203. In addition, keeping valve 314 open allows oxygen to flow through the gas lines 216 and into the deposition chamber 203. The purge sub-cycle may be performed using a flowrate of argon of between about 1500 sccm and about 3600 sccm, at temperatures in the deposition chamber 203 of between about 150° C. and about 250° C., at pressures in the deposition chamber 203 of between about 1.5 Torr and about 2.5 Torr, and for a duration of between about 0.1 seconds and about 2 seconds. In some embodiments, the purge sub-cycle described with respect to FIG. 8E utilizes the same process conditions and parameters as utilized in the purge sub-cycle with respect to FIG. 8C. In other embodiments, the process conditions and parameters may be different.

Figure 8F:
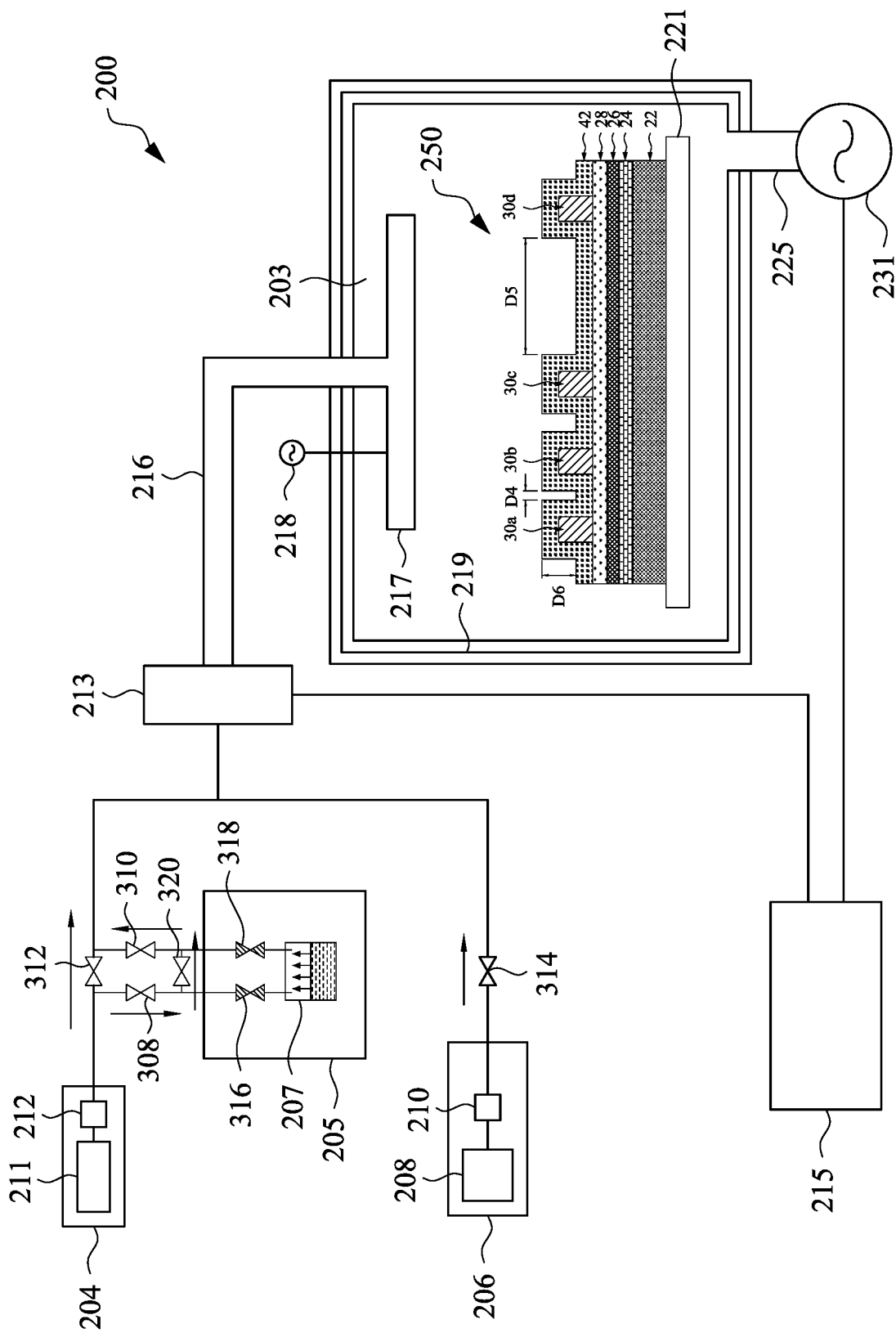

In FIG. 8F, after formation of the spacer layer 42 is complete, the wafer 250 may remain in the deposition chamber 203, and a final purge sub-cycle is performed as illustrated. The final purge sub-cycle clears all or most of remaining process materials from the gas lines 216 and the deposition chamber 203. During the final purge sub-cycle, the inert gas is flowed with the plasma generator 218 turned off. For example, similarly with but somewhat different from the purge sub-cycles discussed above, opening valves 308/310/312/320 and closing valves 314/316/318 will allow the inert gas to be delivered from the inert gas supply 211 to the precursor gas controller 213 and, eventually, to the deposition chamber 203. Note, opening valves 308/310/320 provide additional pathways of the gas lines 216 for the inert gas to flow during the final purge sub-cycle. In other embodiments, the wafer 250 may be removed from the deposition chamber 203 before performing the final purge sub-cycle.

As discussed above, viscous precursors (e.g., the titanium precursor, such as TDMAT) have a tendency to partially condense back into the liquid state and remain in the gas lines 216. While the TDMAT remains in the gas lines 216, materials such as water vapor and oxygen may find their way into the gas lines 216 (e.g., by reverse-flowing through the showerhead 217 and the manifold of the gas lines 216) and react with the TDMAT to form other derivatives of TDMAT, such as clusters of titanium oxide. As a result, clusters of TDMAT-based material (e.g., TDMAT derivatives) remaining in the gas lines 216 may include condensed TDMAT molecules as well as titanium oxide. The titanium oxide clusters may include non-titanium functional groups of the TDMAT due to incompleteness of those reactions.

FIGS. 9A through 13 illustrate a pre-fabrication methodology used to determine one or more parameters for a processing step that utilizes the deposition system 200, such as the final purge sub-cycle recipe. In particular, the pre-fabrication methodology will be described with respect to determining a duration of time for the final purge sub-cycle. For example, the pre-fabrication methodology ensures that the determined duration of time will be long enough for a sufficient amount of the titanium precursor is removed from the gas lines 216. Simultaneously, the pre-fabrication methodology ensures that the determined duration of time will be short enough for the deposition process to meet efficiency specifications by processing at least a desired number of wafers per hour.

The pre-fabrication methodology described herein may be performed prior to the above-described process steps of forming the semiconductor device (see FIGS. 1 through 7) using the deposition system 200 (see FIGS. 8A through 8F). Although the pre-fabrication methodology is described in detail with respect to formation of the spacer layer 42, the pre-fabrication methodology may also be applied to depositions of other layers, such as layers that also use an ALD process that includes a viscous precursor.

Figure 10:
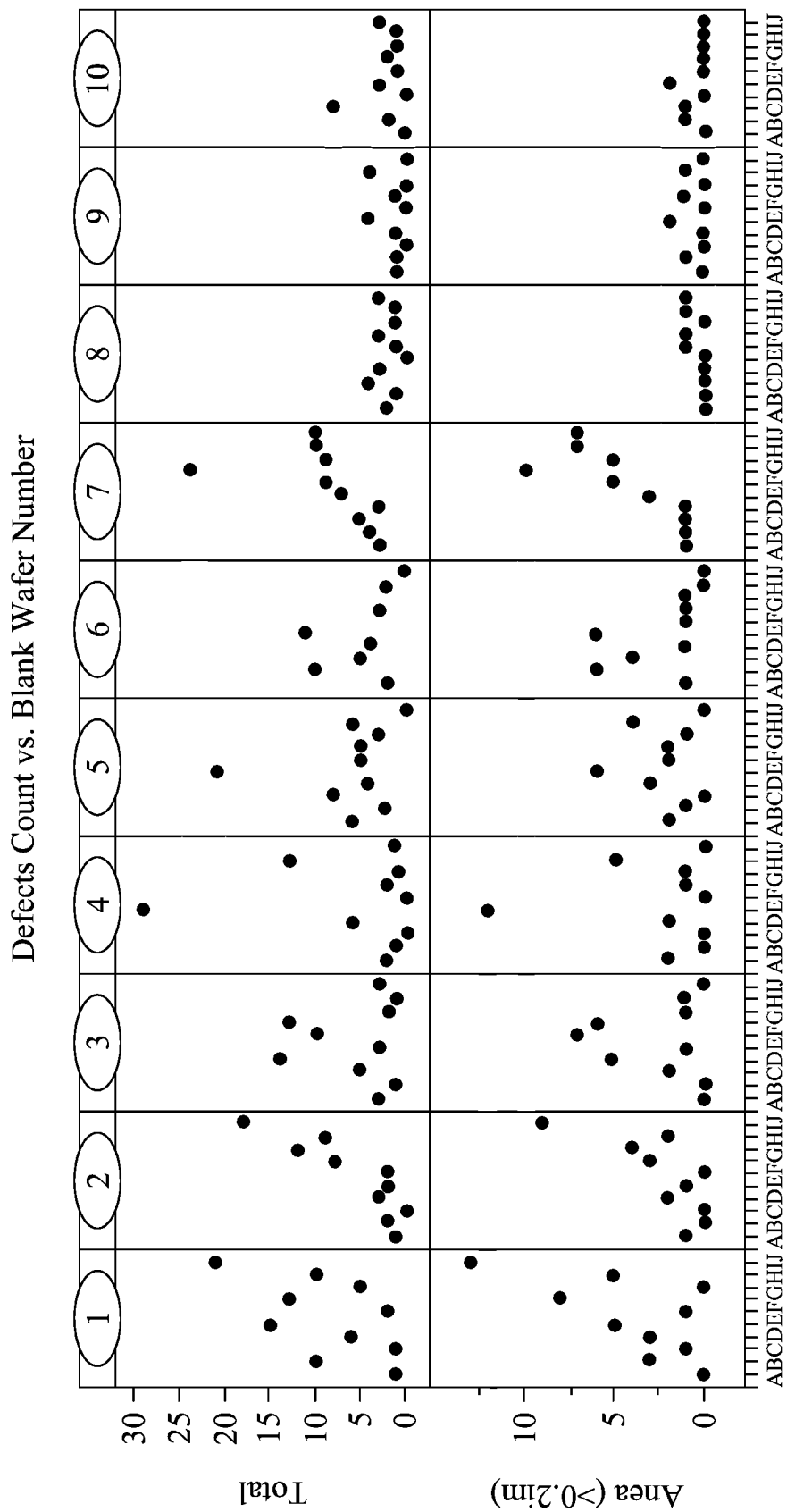
FIG. 10 is a chart of intermediate results during the example method of performing a pre-fabrication methodology, in accordance with some embodiments.
Figure 11:
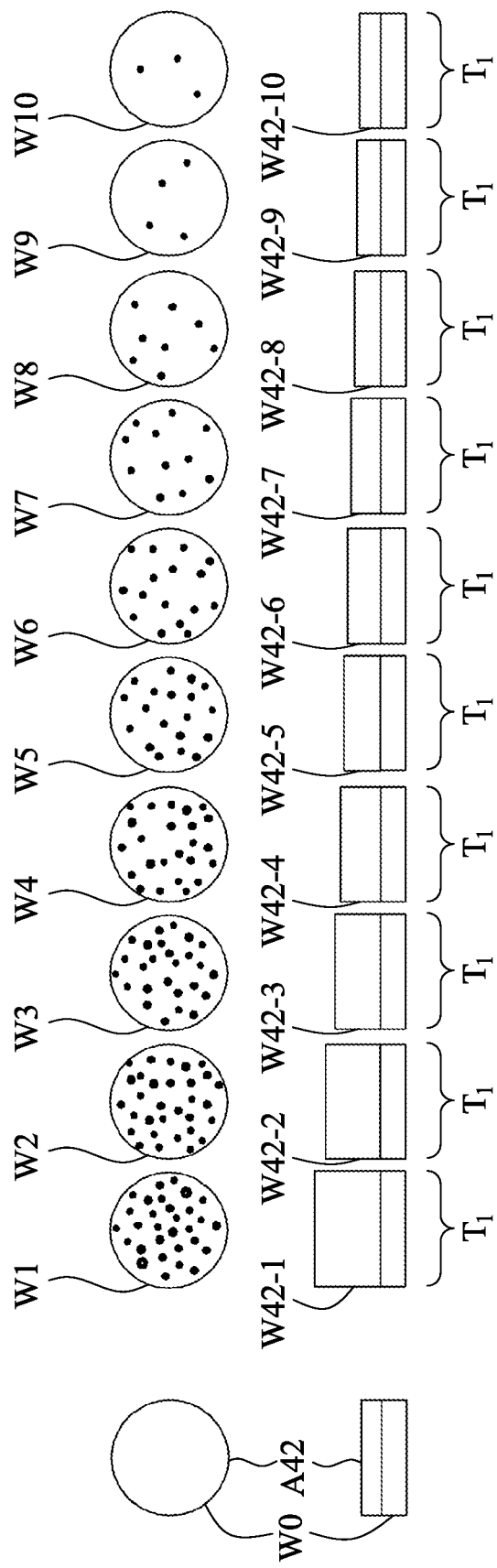
FIG. 11 is a cross-sectional view of intermediate structures during the example method of performing a pre-fabrication methodology, in accordance with some embodiments.
Figure 12:
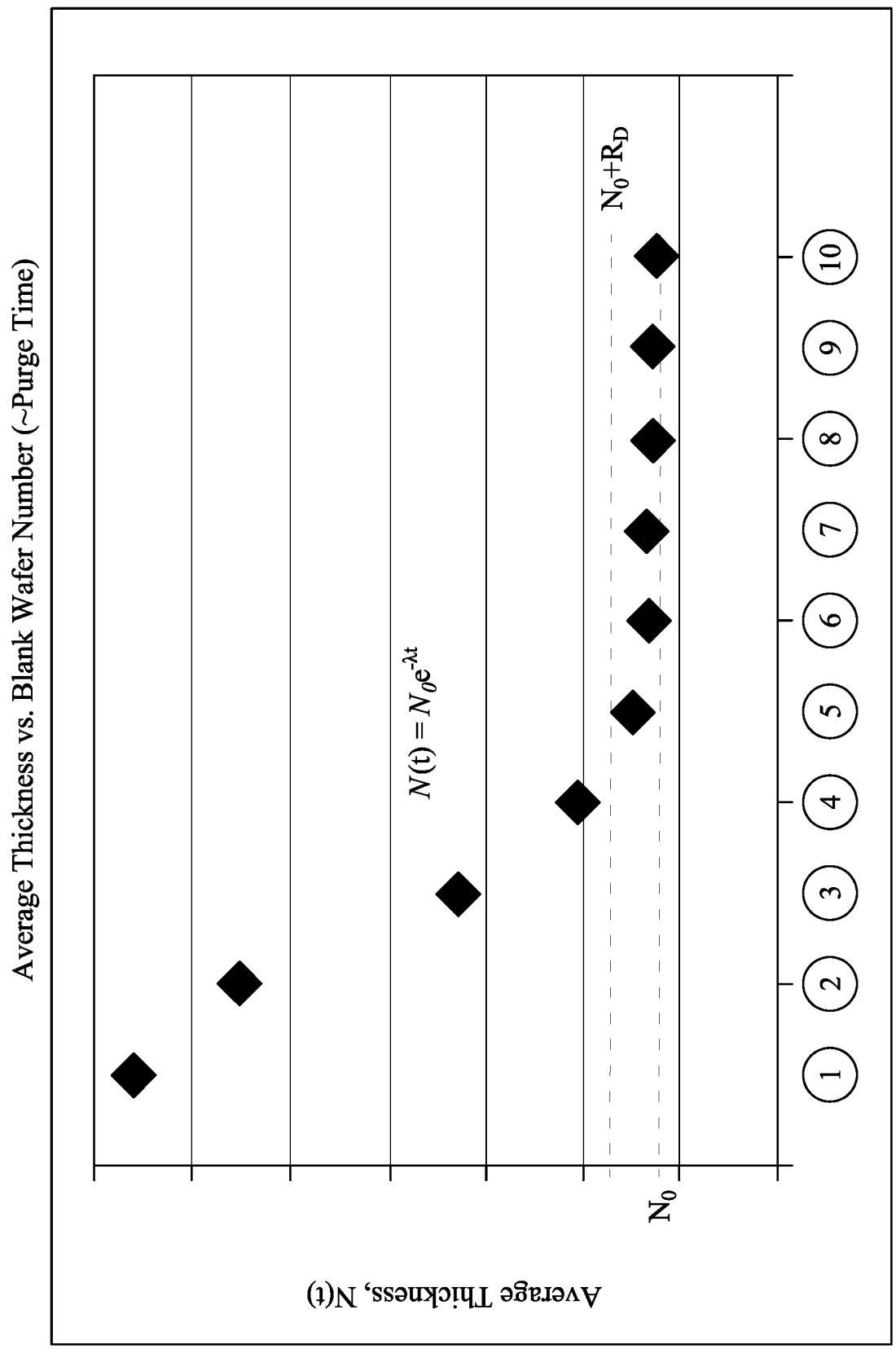
FIGS. 12 through 13 are a graphical illustrations of data collected of intermediate structures during the example method of performing a pre-fabrication methodology, in accordance with some embodiments.

The pre-fabrication methodology includes two parts: a defect deposition (e.g., remaining titanium precursor deposited to react with and/or be absorbed onto a wafer) sub-methodology (see FIGS. 9A, 9B, and 10) and a thickness deviation sub-methodology (see FIGS. 11-12). First, the defect deposition sub-methodology may be used to identify an extent to which a viscous precursor (e.g., TDMAT derivatives, such as TDMAT and TDMAT-based material) may remain in the deposition system 200 (e.g., the gas lines 216 and the precursor gas controller 213) following formation of the spacer layer 42 based on one or more parameters (e.g., duration of the final purge sub-cycle). Second, the thickness deviation sub-methodology may be used to determine one or more parameters (e.g., duration of the final purge sub-cycle) to meet efficiency specifications for wafer-per-hour processing while ensuring amounts of TDMAT-based material (e.g., any amounts or clusters of the titanium precursor and/or titanium oxide) remaining in the deposition system 200 are low enough to have minimal impacts on subsequent wafers and process steps.

Figure 9A:
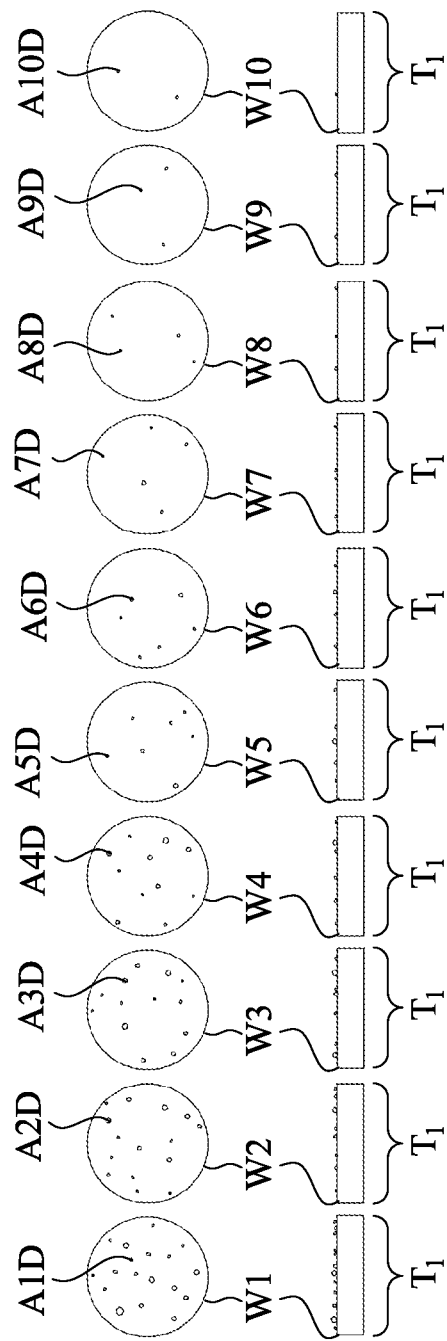
FIGS. 9A and 9B are cross-sectional views of intermediate structures during an example method of performing a pre-fabrication methodology, in accordance with some embodiments.
Figure 9A:
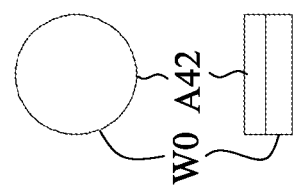
Figure 9B:
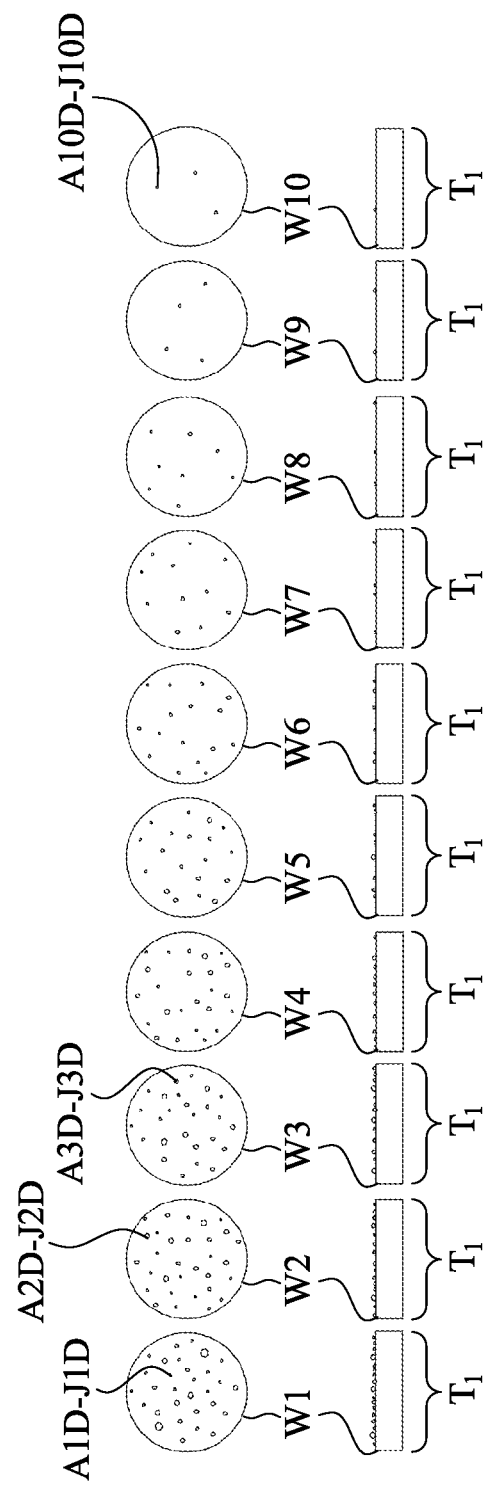
Figure 9B:
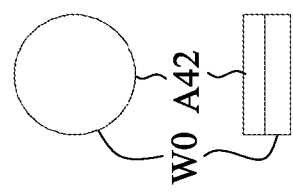

In FIGS. 9A and 9B, the defect deposition sub-methodology is performed on one or more test wafers W0 and a plurality of blank wafers (e.g., ten blank wafers W1-W10). For example, the test wafer W0 and the blank wafers W1-W10 may be planar wafers, such as silicon wafers. The defect deposition sub-methodology begins by performing a test ALD process to form a test layer A42 over the test wafer W0. The test ALD process is performed similarly as the ALD process described above in connection with FIGS. 8A through 8E to form the spacer layer 42, such as using the same parameters, process conditions, and the specified number of cycles. Afterward, the test wafer W0 is removed from the deposition chamber 203, and test final purge sub-cycles (e.g., similarly as the final purge sub-cycle described above in connection with FIG. 8F) are then performed to expel remaining amounts of the titanium-based material (e.g., clusters of titanium precursor and titanium oxide) from the deposition system 200 (e.g., the gas lines 216 and valves 308/310/312/320) onto each of the blank wafers W1-W10 one at a time.

Referring to FIG. 9A, the test layer A42 is deposited over the test wafer W0 using the titanium precursor (e.g., TDMAT), the inert gas, and the oxygen precursor. Afterward, the test wafer W0 is removed from the deposition chamber 203, and a first blank wafer W1 is placed in the deposition chamber 203. The test final purge sub-cycle is performed for time $T_1$ of, for example, 30 seconds (although the time $T_1$ can be selected from any time between about 5 seconds and about 60 seconds). During the test final purge sub-cycle, some of the amounts of the TDMAT-based material remaining in the deposition system 200 (e.g., the gas lines 216) is ejected through the shower head 217 and deposited as defects A1D or clusters onto the first blank wafer W1. As discussed above, the defects A1D may include molecules of the titanium precursor and clusters of titanium oxide (e.g., TDMAT-based material reacting with and/or adsorbed onto the first blank wafer W1). As also discussed above, the clusters of titanium oxide may have formed from ambient water vapor and/or oxygen getting into the deposition system 200 (e.g., the gas lines 216) and reacting with the molecules of the titanium precursor (e.g., TDMAT) remaining therein.

After performing the first portion of the test final purge sub-cycle over the first blank wafer W1 for the time $T_1$, the first blank wafer W1 is removed from the deposition chamber 203 and replaced with a second blank wafer W2. The test final purge sub-cycle is then performed on the second blank wafer W2 for the time $T_1$. As a result, defects A2D from the titanium-based material remaining in the deposition system 200 (e.g., the gas lines 216) that were not already deposited on the first blank wafer W1 are deposited (e.g., reacting and/or adsorbing) onto the second blank wafer W2 similarly as with the defects A1D deposited onto the first blank wafer W1.

The second blank wafer W2 is then removed from the deposition chamber 203 and replaced with a third blank wafer W3 to perform the test final purge sub-cycle for the time $T_1$. The pattern is repeated until the test final purge sub-cycle has been performed for the time $T_1$ through a tenth blank wafer W10 (e.g., the plurality of ten blank wafers W1-W10). Although the defect deposition process is described with respect to the ten blank wafers W1-W10, more or fewer blank wafers may be used. As illustrated, because the titanium precursor is flowed only during deposition of the spacer layer A42 over the test wafer W0, the subsequent test final purge sub-cycles will tend to deposit decreasing amounts of the defects A1D-A10D over the series of the blank wafers W1-W10, respectively. However, it should be noted that the amount of the defects A1D-A10D may not always exhibit a consistent downward trend through each of the blank wafers W1-W10, as shown in FIG. 10.

Further, the test ALD process and test final purge sub-cycle described in connection with FIG. 9A may be repeated over the ten blank wafers W1-W10. For example, a test layer B42 (not separately illustrated) is deposited over another test wafer W0 (or the same test wafer W0 as above), and the test final purge sub-cycles for the time $T_1$ are performed to deposit defects B1D-B10D over the 10 blank wafers W1-W10 (e.g., including the defects A1D-A10D, respectively) for a total number of 10 times. Further, subsequent rounds of the test ALD process and test final purge sub-cycle are performed to form a test layer C42 (not separately illustrated) on another test wafer W0 (or the same test wafer W0) and deposit defects C1D-C10D on the ten blank wafers W1-W10 (e.g., including the defects A1D-B10D, respectively), a test layer D42 (not separately illustrated) on another test wafer W0 (or the same test wafer W0) and defects D1D-D10D on the ten blank wafers W1-W10 (e.g., including the defects A1D-C10D, respectively), and so on through, e.g., through forming a test layer J42 (not separately illustrated) on another test wafer W0 (or the same test wafer W0) and depositing defects J1D-J10D on the ten blank wafers W1-W10 (e.g., including the defects A1D-I10D, respectively). As illustrated in FIG. 9B, after performing the test final purge sub-cycle a total of ten times, each of the ten blank wafers W1 through W10 comprises the defects A1D-A10D through J1D-J10D, respectively.

In FIG. 10, the defects A1D-J10D on the blank wafers W1-W10 are tallied and charted against each corresponding blank wafer number W1-W10. For example, the corresponding blank wafer is scanned before and after each deposition to measure/count the number of defects added by that particular deposition. The top row of FIG. 10 shows tallies of a total number of the defects added to the corresponding blank wafers W1-W10 during each deposition step, and the bottom row of FIG. 10 shows tallies of an average number of the defects added over a unit area, such as between about 200 nm$^2$ and about 0.2 mm$^2$, however any suitable area may be used. In some embodiments, the total and/or average numbers of the defects A1D-J10D may be measured only in certain defined regions (not specifically illustrated in the figures) of each of the blank wafers W1-W10, such as in a central region at which deposition of a greatest amount of the defects A1D-J10D may be expected. However, any other defined regions or the total wafer area may be measured. In an embodiment, the numbers of the defects A1D-J10D may be measured using a wafer inspection system or tool, such as KLA Surfscan SP5 or the like, capable of identifying surface quality and defects.

As illustrated in FIG. 10 and noted above, although a decreasing trend of the amounts of the defects A1D-J10D may be observed from the first blank wafer W1 through to the tenth blank wafer W10 in each round of depositions, the decreasing trend may not be consistently downward. FIG. 10 indicates the amounts of the defects A1D-A10D (as well as B1D-B10D, C1D-C10D, and so on through J1D-J10D) that may be remaining in the deposition system 200 after the deposition of the test layers A42-J42 (e.g., representing the spacer layer 42) over the test wafer(s) W0 as well as after subsequent test final purge sub-cycles of the time $T_1$. For example, the total amount of the defects A6D-J10D across the sixth through the tenth blank wafers W6-W10 are indicative of how much of the titanium-based material may be remaining in deposition system 200 (e.g., the gas lines 216) after the five test final purge sub-cycles of the time $T_1$ for each (e.g., a total time $5T_1$).

The charting in FIG. 10 may be used to determine whether the amount of remaining titanium-based material (as illustrated through the tallied amounts of the defects A1D-J10D) decreases to sufficiently low levels after a specified total time of performing the test final purge sub-cycles. The specified total duration of time may be chosen based on, for example, a maximum time permitted for fabrication of the semiconductor devices in order to maintain a desired wafer-per-hour fabrication rate.

As illustrated, the numbers of the defects A1D-J10D may decrease to the sufficiently low levels within the specified total time (e.g., within time $10T_1$). As a result, the charting in FIG. 10 provides a general or broad determination of when that duration of time occurs. For example, the time at which the numbers of defects A1D-J10D decrease to the sufficiently low levels may be selected as the test final purge sub-cycle duration for the ALD process used in the fabrication of the semiconductor device. For example, in the example illustrated in FIG. 10, a notable and sustained decrease occurs at the eighth blank wafer W8 in the numbers of the defects A8D-J8D, thereby indicating that the total time of purging over the previous seven blank wafers W1-W7 was required to reach those levels. To that extent, the total time of purging from seven test final purge sub-cycles of time $T_1$ would suggest the broad determination for the test final purge sub-cycle recipe to be a duration of at least about time $7T_1$.

In some cases, the numbers of the defects A1D-J10D may not decrease to the sufficiently low levels within the specified total time (e.g., within time $10T_1$). As a result, the parameters of the ALD process (e.g., the final purge sub-cycle recipe or other parameters) may require additional tuning. For example, in some embodiments, the charting of FIG. 10 may indicate that the particular titanium precursor may not be acceptable for use in the deposition system 200, and/or for use with the process parameters used in the ALD process.

In accordance with other embodiments, the defect deposition process described in FIGS. 9-10 may be performed with varying durations of time for each limited duration of the test final purge sub-cycle. For example, if an acceptable duration for the test final purge sub-cycle recipe has been identified to fall within a certain range, then each of the purges over the first blank wafer W1 or over the first few blank wafers W1-W3 may be performed for time $T_1$, while each of the purges over subsequent blank wafers W4-W8 or the remaining of the blank wafers W4-W10 may be performed for time $T_2$. As such, the time $T_2$ may be shorter than the time $T_1$ in order to gather results at shorter intervals of time. For example, time $T_1$ for the blank wafers W1-W3 may be between 5 seconds and 60 seconds, and time $T_2$ for the blank wafers W4-W10 may be between 5 seconds and 60 seconds.

In FIG. 11, the thickness deviation sub-methodology—for a more specific determination of the duration (e.g., as compared to the broad determination from the defect deposition sub-methodology) for the final purge sub-cycle recipe—begins by performing the test ALD process several more times. In particular, the test ALD process is performed to form a first test layer W42-1 over the first blank wafer W1 (which now includes the defects A1D-J1D from the defect deposition sub-methodology discussed above in connection with FIG. 9). Note that, for the sake of comparison, the top-down view of the first blank wafer W1 illustrates the defects A1D-J1D before forming the first test layer W42-1. Although the ALD process steps (and number of cycles) are designed to form the spacer layer 42 (generally) to a specified thickness (e.g., 14.5 nm as discussed above), the presence of the defects A1D-J1D on the first blank wafer W1 causes the resulting first test layer W42-1 with the defects A1D-J1D to have a mean thickness (e.g., an average thickness measured across the first test layer W42-1) that is greater than the specified thickness. For example, the defects A1D-J1D of TDMAT-based material (e.g., comprising molecules of the titanium precursor and molecules of titanium oxide) act as nucleation sites that increase the rate of growth during the deposition of the first test layer W42-1 and/or the mean thickness of the first test layer W42-1.

In accordance with some embodiments, the test ALD process to form the first test layer W42-1 over the first blank wafer W1 may be performed using the same deposition system 200 as described above in connection with FIGS. 8A-8F. In accordance with other embodiments, a different deposition system (not shown) than the deposition system 200 may be used.

After performing the test ALD process, a mean thickness of the first test layer W42-1 (including the defects A1D-J1D) is measured. The test final purge sub-cycle is then performed with an empty deposition chamber 203, the second blank wafer W2 (including the defects A2D-J2D) is placed in the deposition chamber 203, and the test ALD process is performed to form a second test layer W42-2 over the second blank wafer W2. The steps of depositing the third through tenth test layers W42-3 through W42-10, measuring the mean thicknesses, and performing the test final purge sub-cycle are repeated for the rest of the blank wafers W3-W10 (which also include the defects A3D-J3D through A10D-J10D, respectively). In some embodiments, the defects A1D-J1D may be part of or indistinguishable from the first test layer W42-1 and likewise for other test layers W42-2 through W42-10. For the sake of simplicity, reference to the first through the tenth test layers W42-1 through W42-10 may include the corresponding defects A1D through A10D (e.g., the titanium-based material deposited or adsorbed onto the corresponding blank wafers W1-W10).

As illustrated in FIG. 11 (and although not drawn to scale), in comparison to the test layer A42 deposited over the test wafer W0, the first test layer W42-1 formed over the first blank wafer W1 may have a greater mean thickness. In addition, the ninth test layer W42-9 and the tenth test layer W42-10 formed over the ninth blank wafer W9 and the tenth blank wafer W10, respectively, may have mean thicknesses that are about the same as or substantially the same as the specified thickness, such as the mean thickness of the test layer A42 formed over the test wafer W0. Notably, the mean thicknesses of the test layers W42-1 through W42-10 formed over the blank wafers will tend to have a downward trend from the blank wafer W1 through the blank wafer W10, similarly as with the downward trend in the numbers of defects A1D-J10D shown in FIGS. 9-10.

In FIG. 12, a thickness trend graph is plotted to show mean thicknesses N(t) of the first test layers W42-1 through W42-10 on the blank wafers W1-W10. Similarly as with the defects chart in connection with FIG. 10, the thickness trend graph conveys the mean thicknesses N(t) of the test layers W42-1 through W42-10 versus the total test final purge sub-cycle durations of time (e.g., corresponding to the blank wafer numbers). However, it should be noted that the data point for the first blank wafer W1 corresponds to a duration of time zero through time $T_1$, the data point for the second blank wafer W2 corresponds to a duration of time $T_1$ through time $2T_1$, the data point for the third blank wafer W3 corresponds to a block of time $2T_1$ through $3T_1$, and so on. In other embodiments in which the durations of time for the test final purge sub-cycles is varied (e.g., time $T_1 >$ time $T_2 > \ldots >$ time $T_{10}$), then the graph may be plotted to reflect the accumulated durations of time respective to each blank wafer number.

As illustrated, the thickness trend graph may follow a curve, such as defined by equation [1] shown below. According to the equation [1], "N(t)" represents the mean thicknesses of the test layers W42-1 through W42-10 (including the defects A1D-J1D through A10D-J10D, respectively), "$N_0$" represents the specified thickness of the spacer layer 42 (e.g., an average of the test layers A42-J42 formed over the test wafers W0), "λ" represents a constant that encompasses several properties (e.g., the flow rate of the inert gas and the viscosity coefficient of the titanium precursor), and "t" represents the total duration of time for the purge (e.g., calculated by the blank wafer number and the test final purge sub-cycle duration of time $T_1$ (and times $T_2$-$T_{10}$ in embodiments of varying durations) as discussed above). Optionally, the data may be fit to the equation [1] using any suitable method, such as a least squares fit (regression line) or the like.

$$N(t)=N_0 e^{-\lambda t} \quad [1]$$

The thickness trend graph may be utilized to determine a duration of time for the final purge sub-cycle recipe. For example, because fabrication of semiconductor devices are not perfect (e.g., due to process variations), the spacer layer 42 formed during fabrication of the semiconductor device (see FIG. 7) may deviate from the specified thickness $N_0$ by a tolerable range of deviation $R_D$. For example, the tolerable range $R_D$ may be selected based on product specifications. As such, the point at which the thickness trend graph falls within the tolerable range of deviation $R_D$ with respect to the desired thickness $N_0$ may correspond to a minimum duration of time required for the final purge sub-cycle recipe. For the sake of illustration, an arbitrary tolerable range of deviation $R_D$ is marked in FIG. 12. As illustrated, the mean thickness N(t) of the fourth test layer W42-4 on the fourth blank wafer W4 is outside of the tolerable range of thickness $R_D$, while the average thickness N(t) of the fifth test layer W42-5 on the fifth blank wafer W5 is within the tolerable range of thickness $R_D$ (as well as the average thicknesses N(t) of the sixth through tenth test layers W42-6 through W42-10 on the subsequent blank wafers W6-W10). The fifth blank wafer W5 corresponds to a test final purge sub-cycle duration of between $4T_1$ and $5T_1$. The duration of time for the test final purge sub-cycle recipe may be chosen by calculating from the equation [1] precisely at what point the average thickness N(t) falls within the tolerable range of thickness $R_D$, or the conservative approach may suggest choosing the duration of time as $5T_1$ or greater.

Figure 13:
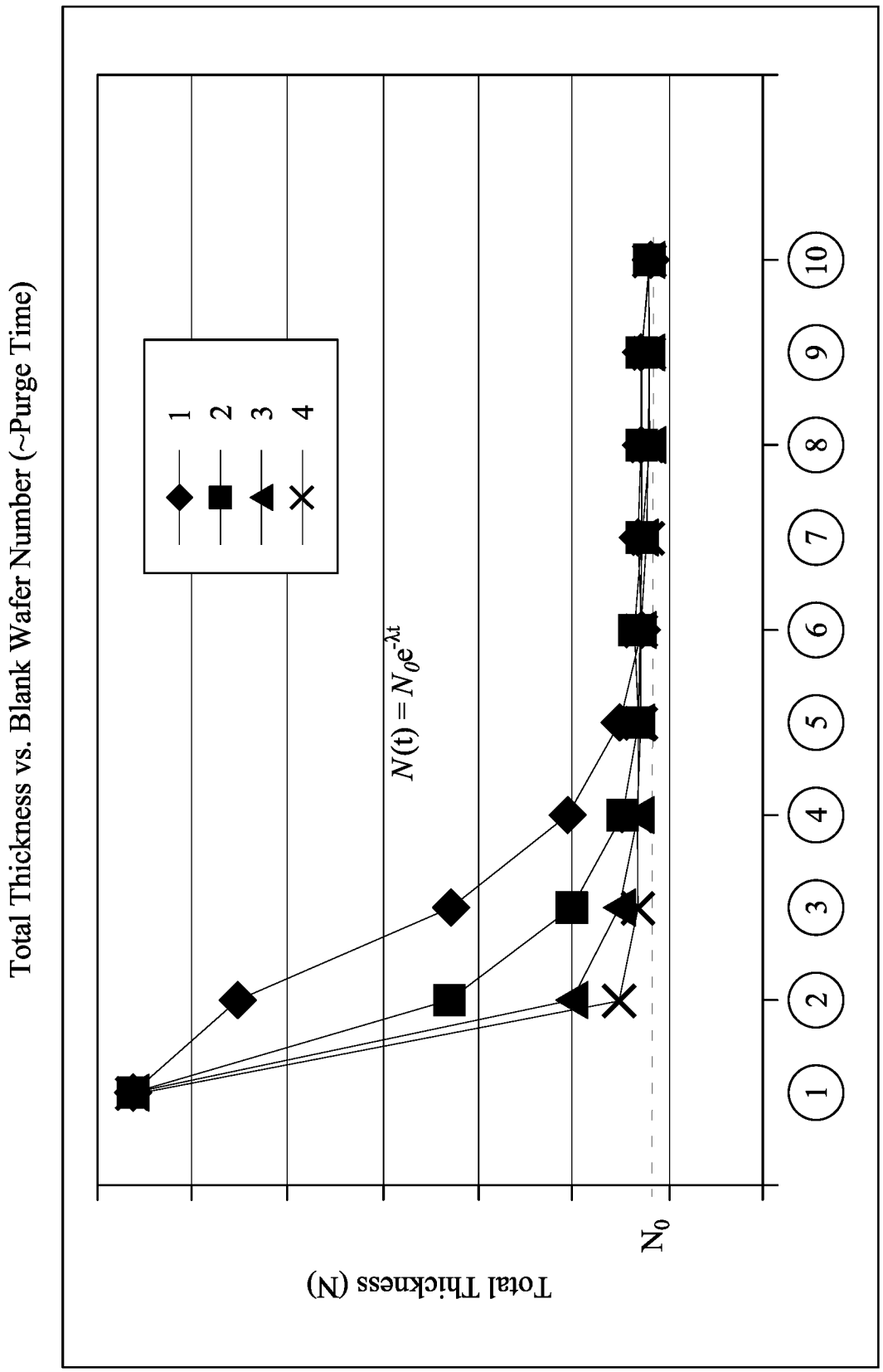

In FIG. 13, the pre-fabrication methodology described above with respect to FIGS. 9 through 12 may be used to adjust not only the time of the final purge sub-cycle recipe (as described above) but may also be used to adjust additional parameters of the test final purge sub-cycle recipe. The additional parameters may include, but not be limited to, the flow rate of the inert gas, a temperature of the bottle 207, and/or a temperature of the gas lines 216 (e.g., the path of the inert gas during the purge sub-cycle using, for example, a heating tape around the gas lines 216). The pre-fabrication methodology may be performed to adjust one of those additional parameters for the final purge sub-cycle recipe. For example, the pre-fabrication methodology may be performed for a first time at a first flow rate of the inert gas, for a second time at a second flow rate (greater than the first flow rate) of the inert gas, for a third time with a third flow rate (greater than the second flow rate) of the inert gas, and for a fourth time with a fourth flow rate (greater than the third flow rate) of the inert gas.

Although not specifically illustrated, the defect deposition sub-methodology may be used to determine whether any of the flow rates of the inert gas may be excluded from the final purge sub-cycle recipe. For example, the tallies of the defect depositions may remain insufficiently high through all ten blank wafers for the first flow rate (e.g., the lowest flow rate) of the inert gas. As a result, the pre-fabrication methodology may be halted for the first flow rate of the inert gas and continued for the other flow rates. In some embodiments, the tallies of the defect depositions may reach sufficiently low levels for all or several of the flow rates of the inert gas. As a result, it may be possible to determine the duration and a flow rate of the inert gas (e.g., a lowest flow rate among those having similar results) for the final purge sub-cycle recipe.

As illustrated, the thickness deviation sub-methodology includes plotting together the results of the four different thickness trend graphs, similarly as described in connection with FIG. 12. As described above, specific determination of the duration for the final purge sub-cycle recipe as well as a value for the flow rate of the inert gas may both be selected based on these results, similarly as described above in connection with FIG. 12. In some embodiments, the pre-fabrication methodology is repeated for one or more of the additional parameters, such as listed above.

Although the pre-fabrication methodology is described above to determine parameters of a recipe for forming the spacer layer 42 comprising titanium oxide for using TDMAT as the titanium precursor (see FIGS. 7-8F), the pre-fabrication methodology may be utilized to determine parameters of a recipe for forming the spacer layer 42 using different precursors or comprising other materials. For example, the pre-fabrication methodology may be used for any of the other titanium precursors provided above, such as TTIP. Further, the pre-fabrication methodology may be performed separately for multiple potential titanium precursors to decide between the potential titanium precursors in addition to determining parameters for the recipe.

As discussed above, the pre-fabrication methodology may be used to determine one or more process conditions and parameters for the formation of the spacer layer 42 in connection with FIG. 7, such as the final purge sub-cycle that follows formation of the spacer layer 42. As such, the final purge sub-cycle may be performed using a flowrate of argon of between about 1500 sccm and about 3600 sccm (or greater than 3600 sccm), at temperatures in the deposition chamber 203 of between about 150° C. and about 250° C., at pressures in the deposition chamber 203 of between about 1.5 Torr and about 2.5 Torr, and for a duration of between about 50 seconds and about 10 minutes. In some embodiments, the final purge sub-cycle may utilize some of the same process conditions and parameters as utilized in the purge sub-cycles (see FIGS. 8C and 8E) and the rest may be different, such as determined by the pre-fabrication methodology.

In other embodiments, such as when the spacer layer 42 comprises silicon nitride or silicon oxide using a silicon precursor, the pre-fabrication methodology may be utilized with respect to the silicon precursor, which may be a viscous material like the exemplary titanium precursors described above. For example, the silicon precursor may have a viscosity of between about 2.1 cps and about 2.3 cps, and may have a similar tendency to condense and remain in the deposition system 200 (e.g., the gas lines 216). Similarly, ambient water vapor and/or oxygen may reach the silicon precursor and form silicon oxide clusters. As such, the defect deposition sub-methodology of the pre-fabrication methodology would include depositing silicon-precursor-based material (e.g., the silicon precursor and/or silicon oxide) remaining in the gas lines 216 after various durations of time of test final purge sub-cycles. In addition, the thickness deviation sub-methodology of the pre-fabrication methodology would include forming test layers comprising silicon nitride over the defects of the silicon-precursor-based material. The mean thicknesses of the resulting test layers would include the silicon-precursor-based defects.

Figure 14:
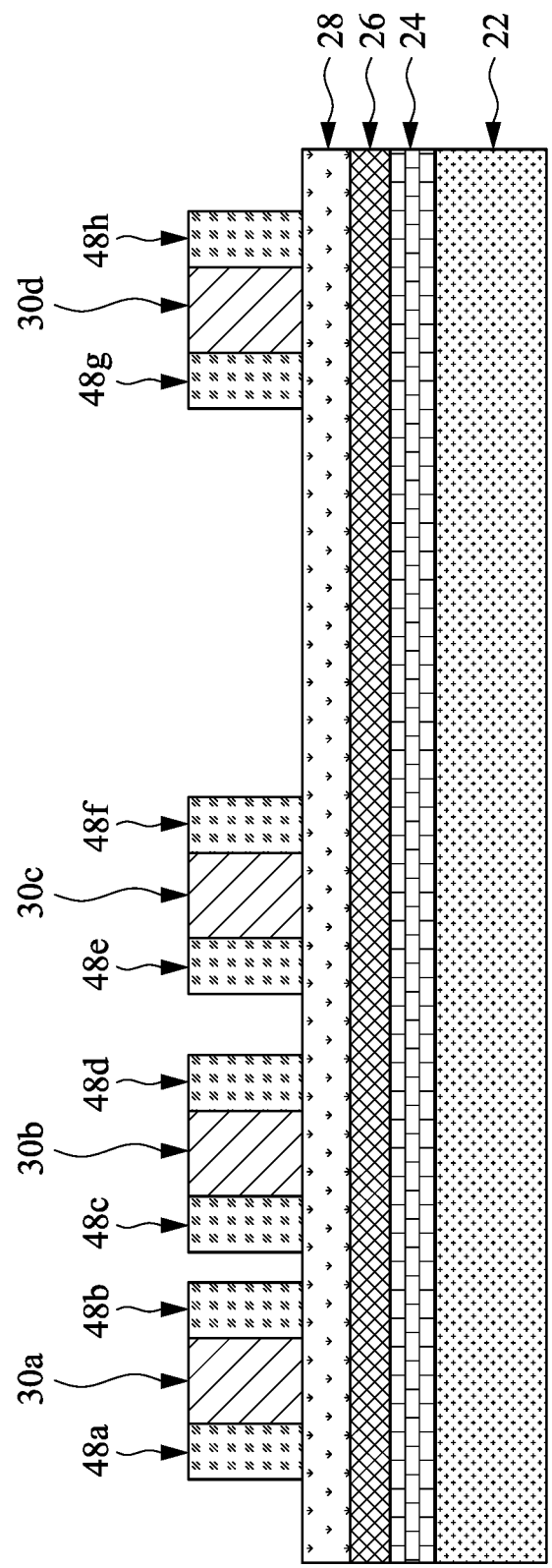
FIGS. 14 through 17 are cross-sectional views of intermediate structures during an example method for forming features of a semiconductor device, in accordance with some embodiments.

FIGS. 14 through 17 illustrate additional processing steps in the fabrication of the semiconductor device following the formation of the spacer layer 42 in connection with FIG. 7. FIG. 14 illustrates the intermediate structure of FIG. 7 after further processing. An etch process is performed. The etch process has a high selectivity to the spacer layer 42 and not to significantly etch the third mask sub-layer 28 and the mandrel layer 30. The etch process can be a wet etch or a dry etch, and may be isotropic or anisotropic.

In some examples, the etch process is a dry plasma etch using a gas comprising chlorine ($Cl_2$) and $CH_4$. In other examples, the etch process is a dry plasma etch using a gas comprising hydrogen bromide (HBr). The gas used in the dry plasma etch can further include a carrier gas, such as nitrogen, argon, or the like. In further examples, the etch process is a wet etch using dilute hydrofluoric (dHF) acid with deionized water (DIW). Further, a combination of the above described etch processes may be utilized.

The etch process removes the horizontal portions of the spacer layer 42 to thereby expose structures, such as the patterned mandrels 30a-d and third mask sub-layer 28, underlying the horizontal portions of the spacer layer 42. The vertical spacer portions 48a-h remain along sidewalls of the patterned mandrels 30a-d.

Figure 15:
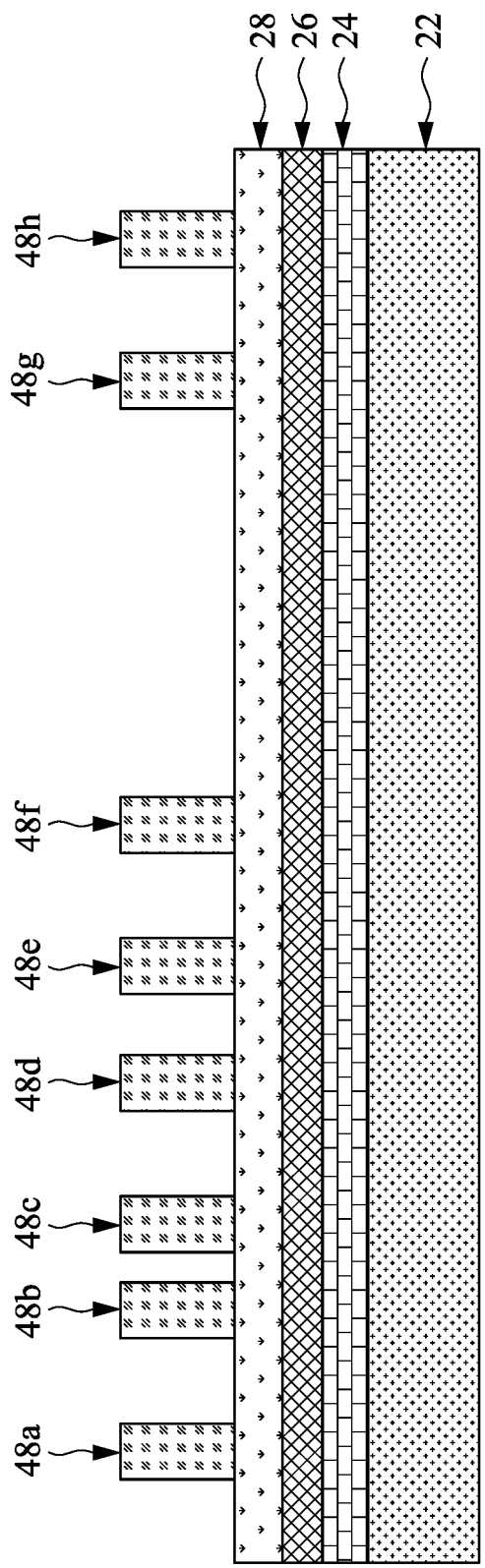

FIG. 15 illustrates the intermediate structure of FIG. 14 after further processing. The patterned mandrels 30a-d are removed. The patterned mandrels 30a-d can be removed by any suitable etch process selective to the material of the patterned mandrels 30a-d. Example etch processes can be a dry etch. For example, a dry etch process can include RIE, NBE, the like, or a combination thereof. A dry etch process can use a gas comprising one or more of carbon tetrafluoride ($CF_4$), chlorine ($Cl_2$), hydrogen bromide (HBr), or the like. For example, the dry etch process can use hydrogen bromide (HBr); a combination of carbon tetrafluoride ($CF_4$), chlorine ($Cl_2$), and hydrogen bromide (HBr); a combination of chlorine ($Cl_2$) and hydrogen bromide (HBr); and/or a combination of carbon tetrafluoride ($CF_4$) and chlorine ($Cl_2$). Oxygen ($O_2$) may also be used in the dry etch process, which may enhance selectivity of the etch process. The dry etch process can be isotropic or anisotropic.

Figure 16:
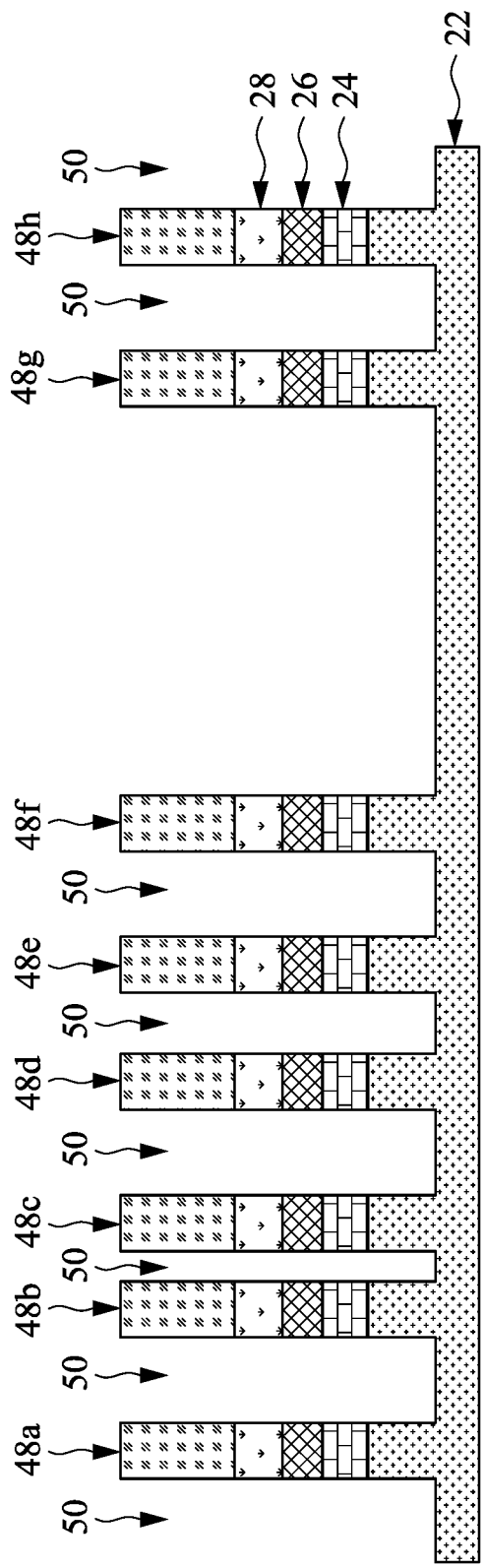

FIG. 16 illustrates the intermediate structure of FIG. 15 after further processing. The pattern of the untreated spacer portions 48a-h is transferred to the mask stack (e.g., the third mask sub-layer 28, the second mask sub-layer 26, and the first mask sub-layer 24) and into the dielectric layer 22 to form recesses 50 (and/or openings) in the dielectric layer 22. One or more etch processes may be used to form the recesses 50 in the dielectric layer 22. For example, due to different etch selectivities between the mask sub-layers 24/26/28 of the mask stack and the dielectric layer 22, a different etch chemistry may be used to transfer the pattern of the untreated spacer portions 48a-h to a different layer or sub-layer. Although the untreated spacer portions 48a-h are illustrated as remaining above the mask stack in FIG. 16, various etch processes used in transferring the pattern of the untreated spacer portions 48a-h to the dielectric layer 22 may consume at least partially the untreated spacer portions 48a-h and/or portions of the mask stack.

Figure 17:
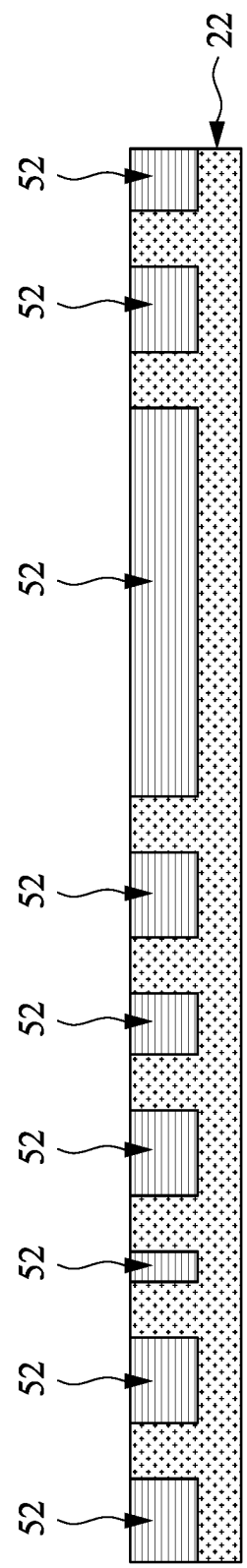

FIG. 17 illustrates the intermediate structure of FIG. 16 after further processing. Conductive features 52 are formed in the dielectric layer 22. For example, a barrier layer can be conformally deposited in the recesses 50 (and/or openings), e.g., along sidewalls and bottom surfaces, in the dielectric layer 22, and a conductive material, such as a metal like copper, tungsten, aluminum, gold, silver, an alloy thereof, the like, or a combination thereof, can be deposited on the barrier layer. The barrier layer may be deposited by any suitable deposition technique, such as ALD, CVD, the like, or a combination thereof, and the conductive material may also be deposited by a suitable deposition technique, such as PVD, CVD, ALD, the like, or a combination thereof. Any excess barrier layer and/or conductive material may be removed, such as by using a CMP to planarize top surfaces of the barrier layer and conductive material to be co-planar with the top surface of the dielectric layer 22. If any of the untreated spacer portions 48a-h and mask stack remain when the barrier layer and/or conductive material are deposited, the CMP may also remove the untreated spacer portions 48a-h and the mask stack. After the CMP, conductive features 52 remain, and the conductive features 52 may be or include conductive lines (e.g., metal lines), conductive vias, and/or conductive contacts. Although not expressly illustrated in FIG. 17, the semiconductor substrate 20 is below the dielectric layer 22.

As discussed above, variations of the pre-fabrication methodology may be used to improve use of the deposition system 200 during formation of the spacer layer 42. In addition, the pre-fabrication methodology may be used to similarly improve other processing steps (e.g., formation of other layers) in the fabrication of the semiconductor device. For example, the pre-fabrication methodology may be performed to determine any or all of the above-discussed parameters for other processing steps.

Embodiments described herein may achieve advantages. In particular, performing the pre-fabrication methodology on one or several processing steps before fabrication of a semiconductor device will improve the yield and efficiency for when fabrication of the semiconductor device is performed. For example, with respect to embodiments of determining the final purge sub-cycle recipe, determining a duration of time ensures that there will be minimal remaining precursor-based material (e.g., titanium-based material) in the gas lines 216 of the deposition system 200 to affect subsequent wafers or subsequent processing steps that use the same deposition system 200. In addition, minimizing the remaining precursor-based material in the deposition system 200 may extend the lifetime of the deposition system 200 and/or reduce the amount of time and frequency of taking the deposition system 200 offline for cleaning and maintenance. Further, determining the duration of time without choosing a duration far beyond what is necessary for the above advantages will minimize the impact that the final purge sub-cycle may have on the wafer-per-hour rate. In some embodiments, the pre-fabrication methodology is performed for the one or several processing steps before beginning the fabrication of the semiconductor device. The pre-fabrication methodology may be most useful with respect to processing steps that have the greatest impacts on the yield and efficiency of the fabrication process.

In an embodiment, a method includes performing a first atomic layer deposition (ALD) process to form a first material layer over a first blank wafer, the first ALD process comprising: performing a first precursor sub-cycle using a first precursor; performing a first purge sub-cycle using a inert gas; and performing a second precursor sub-cycle using a second precursor and the inert gas; and performing a second purge sub-cycle for a first duration over a second blank wafer different from the first blank wafer using the inert gas to deposit first defects onto the second blank wafer. In another embodiment, the first ALD process comprises a number of cycles, each cycle comprising the first precursor sub-cycle, the first purge-sub-cycle, and the second precursor sub-cycle. In another embodiment, the method further includes performing a second ALD process to form a second material layer over the second blank wafer. In another embodiment, the second ALD process comprises the number of cycles. In another embodiment, a mean thickness of the second material layer with the first defects is greater than a mean thickness of the first material layer. In another embodiment, the method further includes, after performing the second purge sub-cycle: performing a third purge sub-cycle for the first duration over a third blank wafer using the inert gas to deposit second defects onto the third blank wafer; and performing a third ALD process to form a third material layer over the third blank wafer. In another embodiment, the method further includes, after performing the third purge sub-cycle: performing a fourth purge sub-cycle for the first duration over a fourth blank wafer using the inert gas to deposit third defects onto the fourth blank wafer; performing a fifth purge sub-cycle for the first duration over a fifth blank wafer using the inert gas to deposit fourth defects onto the fifth blank wafer; performing a fourth ALD process to form a fourth material layer over the fourth blank wafer; and performing a fifth ALD process to form a fifth material layer over the fifth blank wafer. In another embodiment, the method further includes measuring mean thicknesses of the first material layer, the second material layer with the first defects, the third material layer with the second defects, the fourth material layer with the third defects, and the fifth material layer with the fourth defects; and determining a total duration of time for a final purge sub-cycle recipe based on a comparison of the mean thicknesses.

In an embodiment, a method includes depositing a test titanium oxide layer over a test wafer using a deposition system and a deposition recipe, the test titanium oxide layer having a test thickness; after depositing the test titanium oxide layer, purging gas lines of the deposition system for a first duration of time to deposit first clusters of material over a first blank wafer; after purging gas lines of the deposition system for the first duration, purging gas lines of the deposition system for a second duration of time to deposit second clusters of material over a second blank wafer; after purging gas lines of the deposition system for the second duration, purging gas lines of the deposition system for a third duration of time to deposit third clusters of material over a third blank wafer; after purging the gas lines of the deposition system for the first duration of time, depositing a first titanium oxide layer over the first blank wafer, the first titanium oxide layer having a first thickness; after purging the gas lines of the deposition system for the second duration of time, depositing a second titanium oxide layer over the second blank wafer, the second titanium oxide layer having a second thickness; and after purging the gas lines of the deposition system for the third duration of time, depositing a third titanium oxide layer over the third blank wafer, the third titanium oxide layer having a third thickness. In another embodiment, each of the first clusters, the second clusters, and the third clusters comprises titanium. In another embodiment, each of the first clusters, the second clusters, and the third clusters further comprises molecules of a titanium precursor. In another embodiment, the first thickness is greater than the second thickness, wherein the second thickness is greater than the third thickness. In another embodiment, the third thickness is greater than the test thickness. In another embodiment, the method further includes measuring the first clusters of material on the first blank wafer, the second clusters of material on the second blank wafer, and the third clusters of material on the third blank wafer. In another embodiment, the method further includes fitting the test thickness, the first thickness, the second thickness, and the third thickness to a curve.

In an embodiment, a method includes performing a first atomic layer deposition (ALD) process to form a first material layer over a first test wafer, the first material layer having a test thickness, the first ALD process comprising a plurality of cycles, each of the cycles comprising: a first sub-cycle with a first precursor; a second sub-cycle with a second precursor and an inert gas; and a third sub-cycle with the inert gas, the second sub-cycle being a first purge sub-cycle; performing a plurality of fourth sub-cycles with a first flowrate of the inert gas for a duration of time over respective ones of each of a first plurality of blank wafers, each of the plurality of fourth sub-cycles being a second purge sub-cycle, wherein performing the plurality of fourth sub-cycles comprises depositing first derivative material of the second precursor over each of the first plurality of blank wafers; after performing the fourth sub-cycle over each of the first plurality of blank wafers, performing a plurality of second ALD processes to form second material layers over respective ones of each of the first plurality of blank wafers; measuring a first plurality of thicknesses of the second material layers and corresponding portions of the first derivative material formed over the first plurality of blank wafers; and fitting each of the first plurality of thicknesses to an equation. In another embodiment, the equation is $N=N0e-\lambda t$, wherein "N" represents thicknesses comprising the second material layers and the corresponding portions of the first derivative material, wherein "N0" represents the test thickness, wherein "$\lambda$" represents a first constant, and wherein "t" represents time. In another embodiment, "t" corresponds to a sequential order of performing the plurality of fourth sub-cycles on respective ones of each of the first plurality of blank wafers. In another embodiment, the method further includes performing a third ALD process to form a third material layer over a second test wafer; performing a plurality of fifth sub-cycles with a second flowrate of the inert gas for the duration of time over respective ones of each of a second plurality of blank wafers, each of the plurality of fifth sub-cycles being a third purge sub-cycle, wherein performing the plurality of fifth sub-cycles comprises depositing second derivative material of the second precursor over each of the second plurality of blank wafers; after performing the plurality of fifth sub-cycles over respective ones of each of the second plurality of blank wafers, performing a plurality of fourth ALD processes to form fourth material layers over respective ones of each of the second plurality of blank wafers; and measuring a second plurality of thicknesses of the fourth material layers and corresponding portions of the second derivative material over the second plurality of blank wafers. In another embodiment, each of the second material layers and each of the fourth material layers comprises titanium oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a first atomic layer deposition (ALD) process to form a first material layer over a first blank wafer, the first ALD process comprising:
performing a first precursor sub-cycle using a first precursor;
performing a first purge sub-cycle using an inert gas; and
performing a second precursor sub-cycle using a second precursor and the inert gas; and
performing a second purge sub-cycle for a first duration over a second blank wafer different from the first blank wafer using the inert gas to deposit first defects onto the second blank wafer.

2. The method of claim 1, wherein the first ALD process comprises a number of cycles, each cycle comprising the first precursor sub-cycle, the first purge sub-cycle, and the second precursor sub-cycle.

3. The method of claim 2 further comprising performing a second ALD process to form a second material layer over the second blank wafer.

4. The method of claim 3, wherein the second ALD process comprises the number of cycles.

5. The method of claim 3, wherein a mean thickness of the second material layer with the first defects is greater than a mean thickness of the first material layer.

6. The method of claim 5 further comprising, after performing the second purge sub-cycle:
performing a third purge sub-cycle for the first duration over a third blank wafer using the inert gas to deposit second defects onto the third blank wafer; and
performing a third ALD process to form a third material layer over the third blank wafer.

7. The method of claim 6 further comprising, after performing the third purge sub-cycle:
performing a fourth purge sub-cycle for the first duration over a fourth blank wafer using the inert gas to deposit third defects onto the fourth blank wafer;
performing a fifth purge sub-cycle for the first duration over a fifth blank wafer using the inert gas to deposit fourth defects onto the fifth blank wafer;
performing a fourth ALD process to form a fourth material layer over the fourth blank wafer; and
performing a fifth ALD process to form a fifth material layer over the fifth blank wafer.

8. The method of claim 7 further comprising:
measuring mean thicknesses of the first material layer, the second material layer with the first defects, the third material layer with the second defects, the fourth material layer with the third defects, and the fifth material layer with the fourth defects; and
determining a total duration of time for a final purge sub-cycle recipe based on a comparison of the mean thicknesses.

9. A method, comprising:
depositing a test titanium oxide layer over a test wafer using a deposition system and a deposition recipe, the test titanium oxide layer having a test thickness;
after depositing the test titanium oxide layer, purging gas lines of the deposition system for a first duration of time to deposit first clusters of material over a first blank wafer;

after purging gas lines of the deposition system for the first duration, purging gas lines of the deposition system for a second duration of time to deposit second clusters of material over a second blank wafer;

after purging gas lines of the deposition system for the second duration, purging gas lines of the deposition system for a third duration of time to deposit third clusters of material over a third blank wafer;

after purging the gas lines of the deposition system for the first duration of time, depositing a first titanium oxide layer over the first blank wafer, the first titanium oxide layer having a first thickness;

after purging the gas lines of the deposition system for the second duration of time, depositing a second titanium oxide layer over the second blank wafer, the second titanium oxide layer having a second thickness; and after purging the gas lines of the deposition system for the third duration of time, depositing a third titanium oxide layer over the third blank wafer, the third titanium oxide layer having a third thickness.

10. The method of claim 9 further comprising measuring the first clusters of material on the first blank wafer, the second clusters of material on the second blank wafer, and the third clusters of material on the third blank wafer.

11. The method of claim 9 further comprising fitting the test thickness, the first thickness, the second thickness, and the third thickness to a curve.

12. The method of claim 9, wherein each of the first clusters, the second clusters, and the third clusters comprises titanium.

13. The method of claim 12, wherein each of the first clusters, the second clusters, and the third clusters further comprises molecules of a titanium precursor.

14. The method of claim 9, wherein the first thickness is greater than the second thickness, wherein the second thickness is greater than the third thickness.

15. The method of claim 14, wherein the third thickness is greater than the test thickness.

16. A method, comprising:
performing a first atomic layer deposition (ALD) process to form a first material layer over a first test wafer, the first material layer having a test thickness, the first ALD process comprising a plurality of cycles, each of the cycles comprising:
a first sub-cycle with a first precursor;
a second sub-cycle with a second precursor and an inert gas; and
a third sub-cycle with the inert gas, the second sub-cycle being a first purge sub-cycle;
performing a plurality of fourth sub-cycles with a first flowrate of the inert gas for a duration of time over respective ones of each of a first plurality of blank wafers, each of the plurality of fourth sub-cycles being a second purge sub-cycle, wherein performing the plurality of fourth sub-cycles comprises depositing first derivative material of the second precursor over each of the first plurality of blank wafers;
after performing the fourth sub-cycle over each of the first plurality of blank wafers, performing a plurality of second ALD processes to form second material layers over respective ones of each of the first plurality of blank wafers;
measuring a first plurality of thicknesses of the second material layers and corresponding portions of the first derivative material formed over the first plurality of blank wafers; and
fitting each of the first plurality of thicknesses to an equation.

17. The method of claim 16, wherein the equation is $N=N_0 e^{-\lambda t}$, wherein "N" represents thicknesses comprising the second material layers and the corresponding portions of the first derivative material, wherein "$N_0$" represents the test thickness, wherein "$\lambda$" represents a first constant, and wherein "t" represents time.

18. The method of claim 17, wherein "t" corresponds to a sequential order of performing the plurality of fourth sub-cycles on respective ones of each of the first plurality of blank wafers.

19. The method of claim 16 further comprising:
performing a third ALD process to form a third material layer over a second test wafer;
performing a plurality of fifth sub-cycles with a second flowrate of the inert gas for the duration of time over respective ones of each of a second plurality of blank wafers, each of the plurality of fifth sub-cycles being a third purge sub-cycle, wherein performing the plurality of fifth sub-cycles comprises depositing second derivative material of the second precursor over each of the second plurality of blank wafers;
after performing the plurality of fifth sub-cycles over respective ones of each of the second plurality of blank wafers, performing a plurality of fourth ALD processes to form fourth material layers over respective ones of each of the second plurality of blank wafers; and
measuring a second plurality of thicknesses of the fourth material layers and corresponding portions of the second derivative material over the second plurality of blank wafers.

20. The method of claim 19, wherein each of the second material layers and each of the fourth material layers comprises titanium oxide.

* * * * *